(12) United States Patent
Lee

(10) Patent No.: US 11,388,825 B2
(45) Date of Patent: Jul. 12, 2022

(54) STRUCTURE FOR LIMITING MOVEMENT OF ROTATABLE MEMBER AND ELECTRONIC DEVICE COMPRISING SAME

(71) Applicant: Samsung Electronics Co., Ltd., Suwon-si (KR)

(72) Inventor: Hyungwoo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/969,801

(22) PCT Filed: Feb. 19, 2019

(86) PCT No.: PCT/KR2019/001950
§ 371 (c)(1),
(2) Date: Aug. 13, 2020

(87) PCT Pub. No.: WO2019/164206
PCT Pub. Date: Aug. 29, 2019

(65) Prior Publication Data
US 2021/0007233 A1    Jan. 7, 2021

(30) Foreign Application Priority Data
Feb. 21, 2018    (KR) ........................ 10-2018-0020813

(51) Int. Cl.
*H05K 5/02* (2006.01)
*G04G 17/08* (2006.01)
(Continued)

(52) U.S. Cl.
CPC ........... *H05K 5/0217* (2013.01); *G04G 17/08* (2013.01); *G06F 1/163* (2013.01); *G06F 1/3234* (2013.01); *H05K 5/0017* (2013.01)

(58) Field of Classification Search
CPC .... H05K 5/0217; H05K 5/0017; G04G 17/08; G06F 1/163; G06F 1/3234
See application file for complete search history.

(56) References Cited

U.S. PATENT DOCUMENTS

| 6,471,478 B1 | 10/2002 | Mashey | |
|---|---|---|---|
| 2006/0114753 A1* | 6/2006 | Gerber | ................ G04B 47/046 368/295 |

(Continued)

FOREIGN PATENT DOCUMENTS

| JP | 07-004629 Y2 | 2/1995 |
|---|---|---|
| JP | 08-152486 A | 6/1996 |

(Continued)

OTHER PUBLICATIONS

Samsung Newsroom, Samsung Electronics Co., Ltd, Samsung Electronics, Releasing the Three Wearable Health Care Apparatuses Gear Sport, Gear Fit2 Pro, Gear Icon X at IFA 2017, Aug. 31, 2017.

*Primary Examiner* — Hung S. Bui
*Assistant Examiner* — Sagar Shrestha
(74) *Attorney, Agent, or Firm* — Jefferson IP Law, LLP

(57) ABSTRACT

Various embodiments of the present invention relate to an electronic device and, more specifically, to a rotatable member and an electronic device comprising same. Various embodiments of the present invention may provide a structure for limiting movement of a rotatable member, comprising: a housing; an edge part disposed on one surface of the housing; a wheel structure which is spaced apart from the edge part on the one surface of the housing by a predetermined distance and is rotatably installed along the edge part; and a ring structure, disposed in a space formed between the wheel structure and the edge part, for coupling the wheel structure and the edge part to each other, wherein at least a part of the ring structure is supported by the wheel structure so that the horizontal movement of the ring structure is (Continued)

limited, and at least a part of the ring structure has a hook and is supported by the edge part so that the wheel structure is pressed toward the housing due to the bending of the ring structure.

13 Claims, 36 Drawing Sheets

(51) Int. Cl.
*G06F 1/16* (2006.01)
*G06F 1/3234* (2019.01)
*H05K 5/00* (2006.01)

(56) References Cited

U.S. PATENT DOCUMENTS

| | | | |
|---|---|---|---|
| 2008/0068935 | A1 | 3/2008 | Hiranuma et al. |
| 2015/0181087 | A1 | 6/2015 | Mistry et al. |
| 2016/0252888 | A1* | 9/2016 | Kim .................. G06F 1/163 |
| | | | 368/278 |
| 2016/0254587 | A1* | 9/2016 | Jung .................. H01Q 7/00 |
| | | | 343/702 |
| 2017/0048994 | A1* | 2/2017 | Lee .................. G04G 17/08 |
| 2017/0097614 | A1* | 4/2017 | Kang ................ G04G 9/122 |
| 2018/0063981 | A1* | 3/2018 | Park ................. H04R 1/023 |
| 2018/0307333 | A1* | 10/2018 | Lim ................ G04G 17/045 |
| 2019/0012004 | A1* | 1/2019 | Kim ................ G06F 3/0234 |
| 2019/0113889 | A1* | 4/2019 | Kumar ............... G04G 21/00 |
| 2019/0204790 | A1* | 7/2019 | Kim ................. G04G 9/007 |
| 2020/0117342 | A1* | 4/2020 | Jatram ............ G06F 3/0482 |

FOREIGN PATENT DOCUMENTS

| | | |
|---|---|---|
| KR | 10-2016-0105016 A | 9/2016 |
| KR | 10-2017-0020149 A | 2/2017 |

* cited by examiner

STRUCTURE FOR LIMITING MOVEMENT OF ROTATABLE MEMBER AND ELECTRONIC DEVICE COMPRISING SAME

CROSS-REFERENCE TO RELATED APPLICATION(S)

This application is a National Phase Entry of PCT International Application No. PCT/KR2019/001950, which was filed on Feb. 19, 2019 and claims priority to Korean Patent Application No. 10-2018-0020813, which was filed on Feb. 21, 2018 in the Korean Intellectual Property Office, the contents of which are incorporated herein by reference.

BACKGROUND

1. Field

Various embodiments of the disclosure relate to an electronic device and, more particularly, to a structure for limiting the movement of a rotatable member and an electronic device including the same.

2. Description of the Related Art

In general, an electronic device refers to a device configured to perform a specific function according to a program installed therein, such as a home appliance, an electronic wallet, a portable multimedia playback device, a mobile communication terminal, a tablet PC, an image/sound device, a desktop/laptop computer, and a vehicular navigation device.

For example, such electronic devices may output stored information as sounds or images. In line with the high degree of integration of electronic devices and the widespread use of super-fast/large-capacity wireless communication, each mobile communication terminal has recently been equipped with various functions.

For example, not only a communication function, but also an entertainment function (for example, gaming), a multimedia function (for example, music/moving image playback), a communication/security function for mobile banking or the like, a schedule management function, and an electronic wallet function tend to be integrated in a single electronic device.

In addition, wearable electronic devices in various shapes (for example, glasses and watches), which can be worn on human bodies and used accordingly, have recently been proposed.

In addition to the integration of various functions, such electronic devices may be required to have slim shapes, compact shapes, and/or simple exteriors such that users can enjoy aesthetic appearances and be provided with convenience.

In an effort to provide users with convenient interfaces with various functions of electronic devices in line with the above-mentioned demands, electronic devices having various types of wheel structures (which may be referred to as wheel bezels or wheel structures, for example) applied thereto have recently been proposed.

SUMMARY

An electronic device may have a wheel structure provided on the housing of the electronic device to be able to rotate such that the user can turn on/off the power supply of the electronic device while rotating the wheel structure. In addition, the user may execute the electronic device in a sleep mode state, in which only the power supply is turned on, or may execute a function of the electronic device so as to input a command to the electronic device in a driving mode state. Various functions of the electronic device may be selectively implemented by using the wheel structure.

The wheel structure may be provided to be able to make a 360° rotation while facing a surface of the housing of the electronic device. In order to improve the durability of the electronic device and to increase the degree of input precision while enabling the wheel structure to rotate with regard to the housing, it may be necessary to appropriately limit movements in the horizontal or vertical direction while allowing free rotations in a designated direction.

To this end, the electronic device may have a ring structure disposed between the wheel structure and the housing and made of a metal or plastic material in an approximately "O" shape (which may be referred to as wheel fixing member, for example).

According to various embodiments of the disclosure, there may be provided an electronic device including: a housing including a rear plate facing in a first direction and a side member coupled to the rear plate, wherein the rear plate and the side member form a recess having a circular periphery; a circular display positioned at least partially in the recess; a wheel structure rotatable around the display; and a ring structure formed of a polymeric material. When viewed from above the recess, the side member may include: a first surface facing in a second direction opposite to the first direction, the first surface including an inner edge and an outer edge; and an annular protrusion protruding from the inner edge, while defining the circular periphery. The annular protrusion may include: a second surface facing away from the recess in a third direction substantially perpendicular to the second direction; and a first extension slot formed in the second surface near the recess. The wheel structure may include: a first inner surface facing the first surface; a second inner surface facing the second surface; and a second extension slot formed on the second inner surface around the recess. The ring structure may include a plurality of portions, each of the plurality of portions being partially inserted into the first extension slot and partially inserted into the second extension slot. At least one of the plurality of portions may include an upper surface facing in a fourth direction forming an angle of 5-45° with the second direction.

According to various embodiments of the disclosure, there may be provided a structure for limiting movements of a rotatable member, the structure including: a housing; an edge portion disposed on a surface of the housing; a wheel structure installed on a surface of the housing to be able to rotate along the edge portion while being spaced apart from the edge portion by a predetermined interval; and a ring structure disposed in a space formed between the wheel structure and the edge portion so as to fasten the wheel structure and the edge portion. At least a part of the ring structure may be supported by the wheel structure such that the horizontal movement thereof is limited. The ring structure may have a hook formed on at least a part thereof and may be supported by the edge portion such that the wheel structure is pressed against the housing by means of bending of the ring structure.

According to various embodiments of the disclosure, there may be provided an electronic device including: a housing including a rear plate facing in a first direction, a side member connected to the rear plate, and a first surface connected from the side member so as to face in a second direction opposite to the first direction; an annular edge portion disposed on the first surface of the housing; a wheel structure capable of rotating around the edge portion; and a ring structure disposed between at least a part of the edge portion and at least a part of the wheel structure. The ring structure may have a plurality of protrusions formed thereon, the plurality of protrusions including a first protrusion facing the edge portion and a second protrusion positioned on a virtual straight line joining the first protrusion and the center of the ring structure. The distance between the second protrusion and the housing may be larger than the distance between the first protrusion and the housing.

According to various embodiments of the disclosure, a wheel structure is configured on a housing to be able to rotate, and a component capable of limiting movements of the wheel structure in the horizontal and vertical directions from the housing is provided. The structure may be simplified by implementing a single component having such a function.

According to various embodiments of the disclosure, an electronic device may be provided, which is configured such that a wheel structure is provided on a housing to be able to rotate, movements thereof are limited, and it is possible to secure ease of assembling the electronic device and durability of components against impacts occurring while the wheel structure operates.

According to various embodiments of the disclosure, an electronic device may be provided, which is configured such that a wheel structure is provided on a housing to be able to rotate, and a component provided to limit movements thereof is made of a material having elasticity and/or lubricity, thereby limiting occurrence of noise and dust during friction resulting from rotation of the wheel structure.

According to various embodiments of the disclosure, the plurality of protrusions may be configured to form different gaps with regard to a housing, thereby limiting horizontal movements of a wheel structure and preventing jamming thereof. In addition, according to an embodiment, if protrusions facing each other in opposite directions with reference to the center of the entire ring structure are configured to have different heights (for example, the first protrusion is formed to have a small amount of gap, and the second protrusion is formed to have a large amount of gap), then the gap between a part of the wheel structure and the housing is reduced such that, even if an overlap occurs, the amount of gap on the opposite side is secured, thereby preventing Jamming.

According to various embodiments of the disclosure, a hook-shaped ring structure may be included such that the wheel structure is forced against the housing, thereby advantageously maintaining an appropriate gap in the vertical direction and preventing fluctuation.

DETAILED DESCRIPTION

Figure 1:
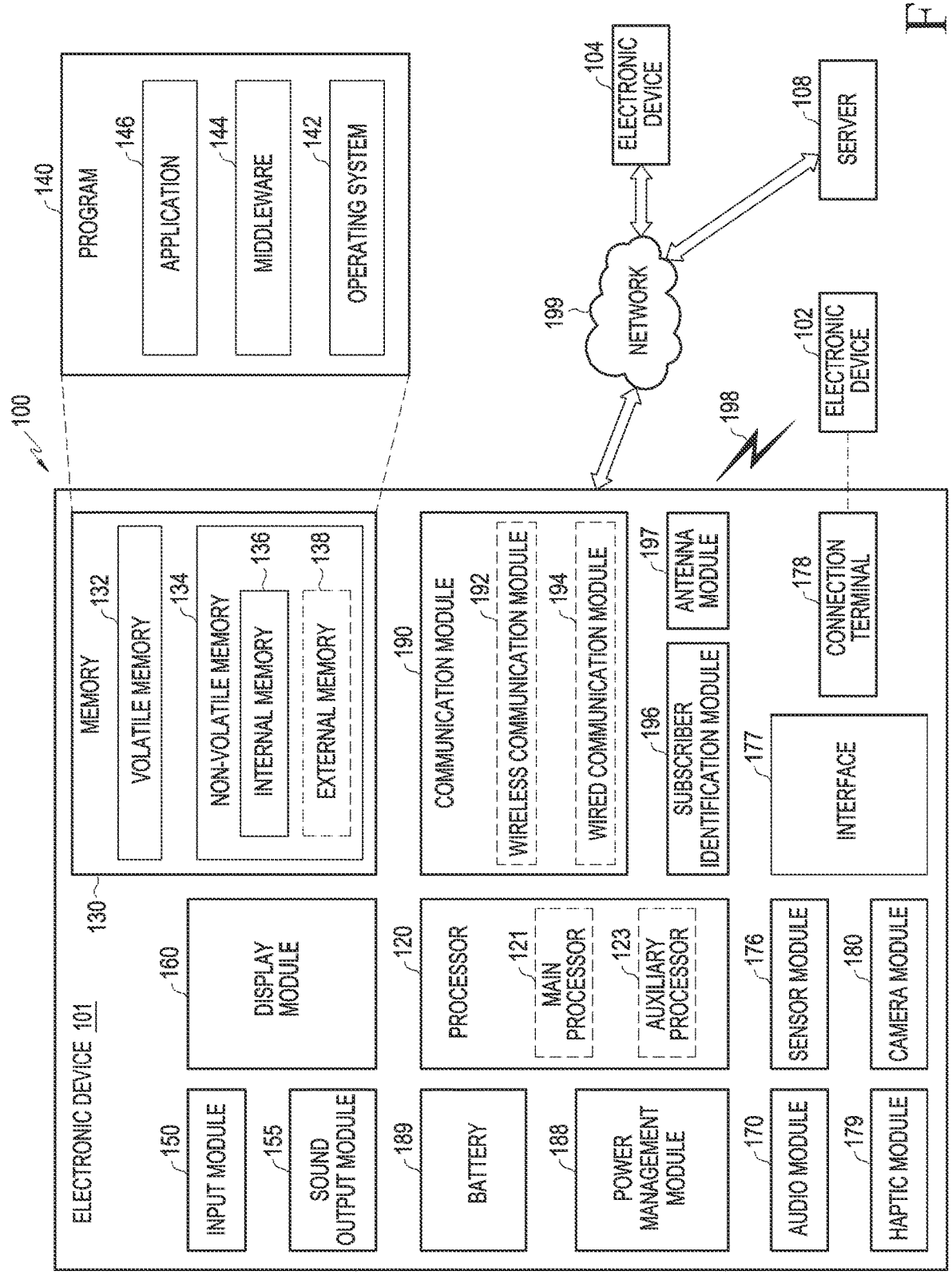
FIG. 1 is a block diagram of an electronic device inside a network environment according to various embodiments of the disclosure.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera assembly 180, a power management module 188, a battery 189, a communication module 190, a subscriber identification module (SIM) 196, or an antenna module 197. In some embodiments, at least one (e.g., the display device 160 or the camera assembly 180) of the components may be omitted from the electronic device 101, or one or more other components may be added in the electronic device 101. In some embodiments, some of the components may be implemented integrated and implemented as in, for example, the sensor module 176 (e.g., a fingerprint sensor, an iris sensor, or an illuminance sensor) embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing and computation. The processor 120 may load and process a command or data received from another component (e.g., the sensor module 176 or the communication module 190) in volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from the main processor 121. Additionally or alternatively, the auxiliary processor 123 may be adapted to consume less power than the main processor 121, or to be specific to a specified function. Here, the auxiliary processor 123 may be operated separately from or embedded in the main processor 121.

In such a case, the auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera assembly 180 or the communication module 190) functionally related to the auxiliary processor 123. The memory 130 may store various data used by at least one component (e.g., the processor 120 or the sensor module 176) of the electronic device 101, for example, software (e.g., the program 140) and input data or output data for a command related thereto. The memory 130 may include the volatile memory 132 or the non-volatile memory 134.

The program 140 is software stored in the memory 130, and may include, for example, an operating system (OS) 142, middleware 144, or an application 146.

The input device 150 is a device configured to receive a command or data to be used by a component (e.g., the processor 120) of the electronic device 101, from the outside (e.g., a user) of the electronic device 101, and may include, for example, a microphone, a mouse, or a keyboard.

The sound output device 155 is a device configured to output sound signals to the outside of the electronic device 101, and may include, for example, a speaker or a receiver. The speaker may be used for general purposes, such as playing multimedia or playing record, and the receiver may be used only for incoming calls. According to an embodiment, the receiver may be implemented as separate from, or as part of the speaker.

The display device 160 is a device configured to visually provide information to a user of the electronic device 101, and may include, for example, a display, a hologram device, or a projector and control circuitry to control a corresponding one of the display, hologram device, and projector. According to an embodiment, the display device 160 may include touch circuitry or a pressure sensor adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) wiredly or wirelessly coupled with the electronic device 101.

The sensor module 176 may generate an electrical signal or data value corresponding to an internal operational state (e.g., power or temperature) of the electronic device 101 or an environmental state external to the electronic device 101. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support specified protocols to be used for the electronic device 101 to be coupled with the external electronic device (e.g., the electronic device 102) wiredly or wirelessly. According to an embodiment, the interface 177 may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102), for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera assembly 180 may capture a still image or moving images. According to an embodiment, the camera assembly 180 may include one or more lenses, image sensors, image signal processors, or flashes.

The power management module 188 is a module configured to manage power supplied to the electronic device 101, and may be implemented as at least part of, for example, a power management integrated circuit (PMIC).

The battery 189 is a device configured to supply power to at least one component of the electronic device 101, and may include, for example, a primary cell which is not rechargeable, a secondary cell which is rechargeable, or a fuel cell.

The communication module 190 may support establishing a wired communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a wired communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules 190 may be implemented as a single chip or may be implemented as separate chips, respectively.

According to an embodiment, the wireless communication module 192 may identify and authenticate the electronic device 101 in a communication network, using user information stored in the subscriber identification module 196.

The antenna module 197 may include at least one antenna module for transmitting or receiving a signal or power to or from the outside of the electronic device 101. According to an embodiment, the communication module 190 (e.g., the wireless communication module 192) may transmit or receive a signal to or from the external electronic device via an antenna appropriate for a communication scheme.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices. According to an embodiment, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the function requested or an additional function, and transfer an outcome of the performing to the electronic device 101. The electronic device 101 may provide the function or service requested, with or without further processing of the outcome. To that end, a cloud computing, distributed computing, or client-server computing technology may be used, for example.

Figure 2A:
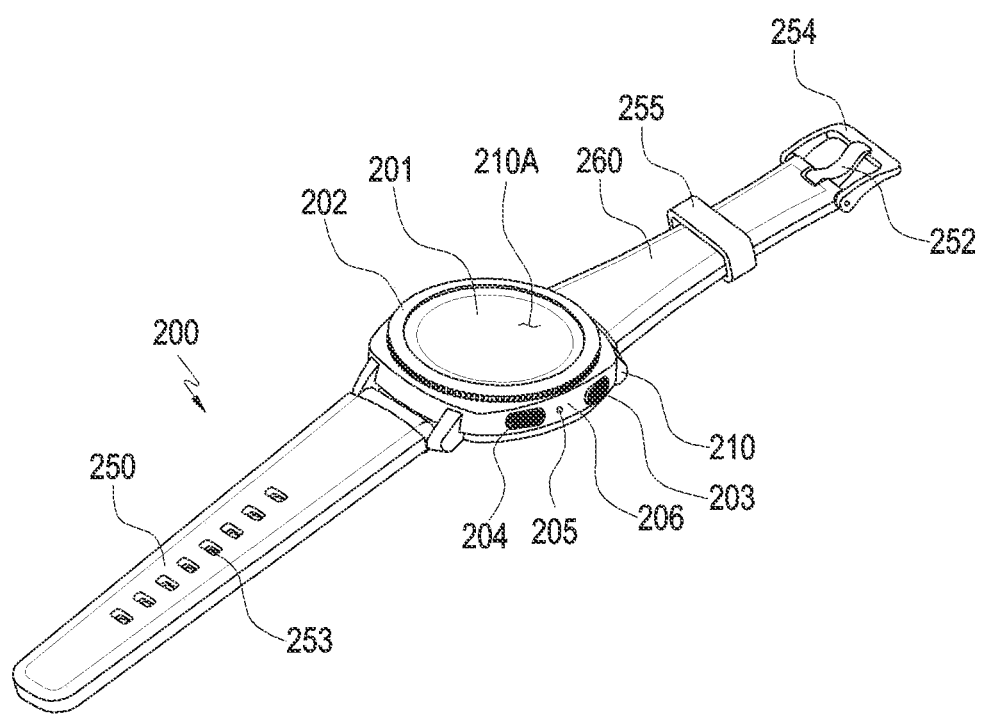
FIG. 2A is a front perspective view of a mobile electronic device according to an embodiment.
Figure 2B:
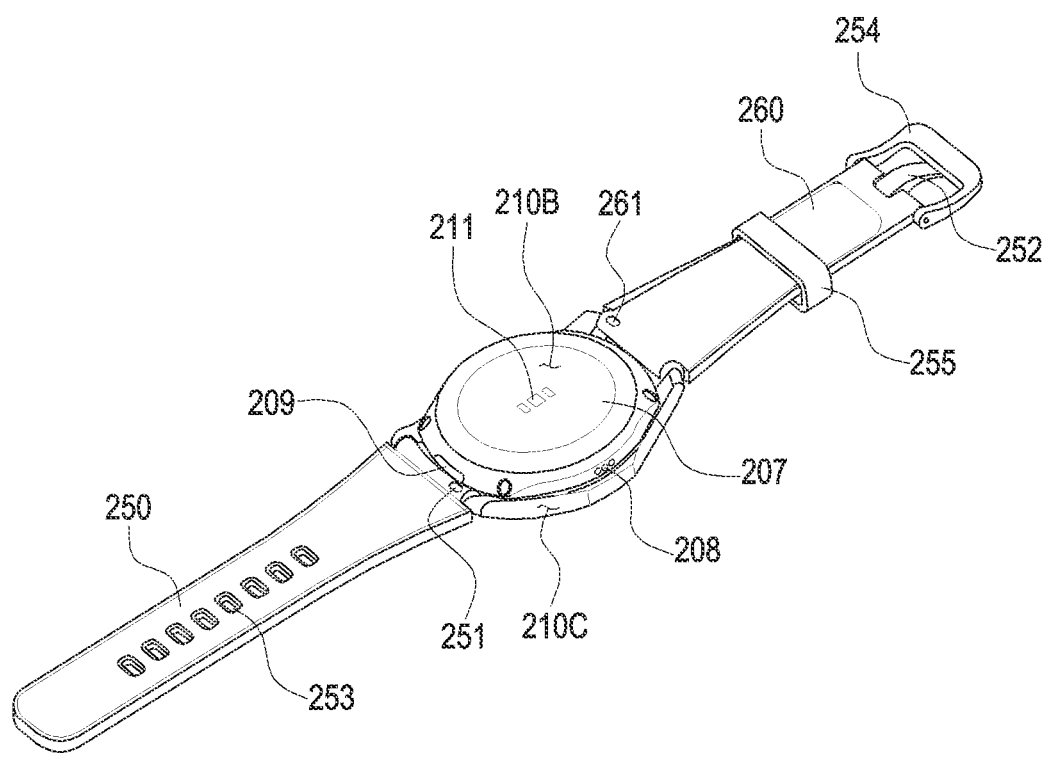
FIG. 2B is a rear perspective view of the electronic device in FIG. 2A.
Figure 3:
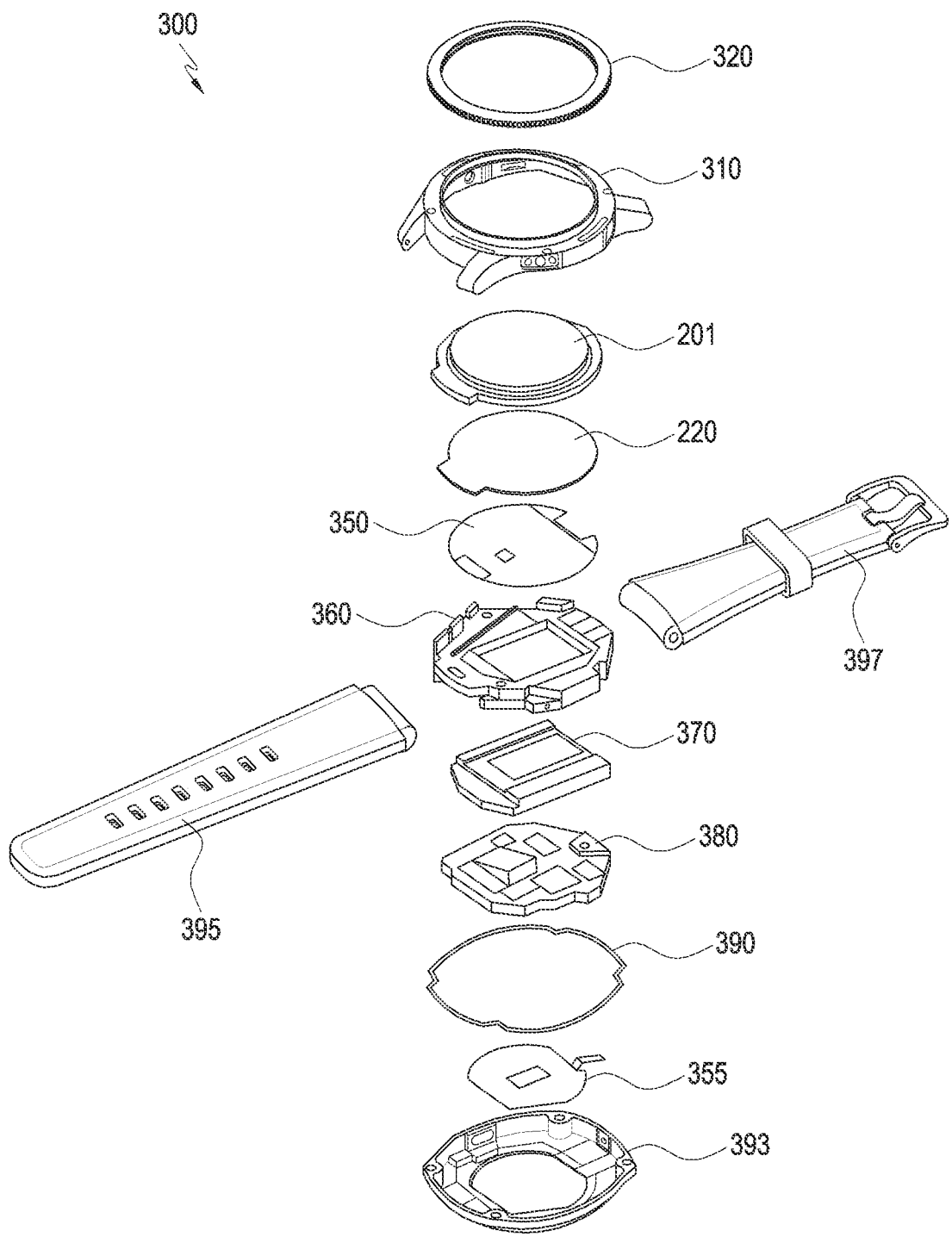
FIG. 3 is an exploded perspective view of the electronic device in FIG. 2A.

FIG. 2A is a front perspective view of a mobile electronic device 200 according to an embodiment. FIG. 2B is a rear perspective view of the electronic device 200 in FIG. 2A. FIG. 3 is an exploded perspective view of the electronic device (for example, 200) in FIG. 2A. Referring to FIG. 2A and FIG. 2B, the electronic device 200 according to an embodiment may include: a housing 210 including a first surface (or front surface) 210A, a second surface (or rear surface) 210B, and a side surface 210C surrounding the space between the first surface 210A and the second surface 210B; and clamping members 250 and 260 connected to at least a part of the housing 210 so as to clamp the electronic device 200 to a part of the user's body (for example, wrist or ankle) in an attachable/detachable manner. In another embodiment (not illustrated), the housing may refer to a structure forming a part of the first surface 210A, the second surface 210B, and the side surface 210C in FIG. 2A. According to an embodiment, the first surface 210A may be formed by a front plate 201, at least a part of which is substantially transparent (for example, glass plate including various coating layers, or polymer plate). The second surface 210B may be formed by a rear plate 207 (or bottom plate) which is substantially opaque. The rear plate 207 may be made of, for example, coated or colored glass, ceramic, a polymer, a metal (for example, aluminum, stainless steel (STS), or magnesium), or a combination of at least two of the above materials. The side surface 210C may be formed by a side bezel structure (or "side member") 206 which is coupled to the front plate 201 and the rear plate 207, and which includes a metal and/or a polymer. In some embodiments, the rear plate 207 and the side bezel structure 206 may be formed integrally and may include the same material (for example, metal material such as aluminum). The clamping members 250 and 260 may be made of various materials in various shapes. A plurality of integrated unit links may be made of a woven material, leather, rubber, urethane, metal, ceramic, or a combination of at least two of these materials and formed such that they can move with regard to each other.

According to an embodiment, the electronic device 200 may include at least one of a display 220 (see FIG. 2B), audio modules 205 and 208, a sensor module 211, key input devices 202, 203, and 204, and a connector hole 209. In some embodiment, at least one component (for example, the key input devices 202, 203, and 204, the connector hole 209, or the sensor module 211) of the electronic device 200 may be omitted, or the electronic device 200 may further include another component.

The display 220 may be exposed through a corresponding portion of the front plate 201, for example. The display 220 may have a shape corresponding to the shape of the front plate 201, such as circular, elliptical, polygonal, or other various shapes. The display 220 may be coupled to a touch sensing circuit, a pressure sensor capable of measuring the intensity (pressure) of a touch, and/or a fingerprint sensor, or may be disposed adjacent thereto.

The audio modules 205 and 208 may include a microphone hole 205 and a speaker hole 208. The microphone hole 205 may have a microphone disposed therein so as to acquire an external sound, and may have a plurality of microphones disposed therein, in some embodiments, such that the direction of a sound can be sensed. The speaker hole 208 may be used as an external speaker and a telephone call receiver. In some embodiments, the speaker holes 207 and 214 and the microphone hole 205 may be implemented as a single hole, or a speaker (for example, piezoelectric speaker) may be included without the speaker holes 207 and 214.

The sensor module 211 may produce an electric signal or a data value corresponding to the operating state inside the electronic device 200, or to the environment state outside the same. The sensor module 211 may include a biometric sensor module 211 (for example, HRM sensor) disposed on the second surface 210B of the housing 210, for example. The electronic device 200 may further include a sensor module (not illustrated), for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor.

The key input devices 202, 203, and 204 may include a wheel key 202 disposed on the first surface 210A of the housing 210 to be able to rotate in at least one direction, and/or side key buttons 202 and 203 disposed on the side surface 210C of the housing 210. The wheel key may have a shape corresponding to that of the front plate 201. In another embodiment, the electronic device 200 may not include some or all of the above-mentioned key input devices 202, 203, and 204, and the key input devices 202, 203, and 204 that are not included may be implemented on the display 220 in other types (for example, soft keys). The connector hole 209 may include another connector hole (not illustrated) which can contain a connector (for example, USB connector) for transmitting/receiving power and/or data with an external electronic device, and which can contain a connector for transmitting/receiving an audio signal with the external electronic device. The electronic device 200 may further include a connector cover (not illustrated) which covers at least a part of the connector hole 209, for example, and which blocks inflow of external alien substances into the connector hole.

The clamping members 250 and 260 may be clamped in at least a partial area of the housing 210 in an attachable/detachable manner by using locking members 251 and 261. The clamping members 250 and 260 may include at least one of a fixing member 252, a fixing member fastening hole 253, a band guide member 254, and a band fixing ring 255.

The fixing member 252 may be configured to fixe the housing 210 and the clamping members 250 and 260 to a part of the user's body (for example, wrist or ankle). The fixing member fastening hole 253 may corresponds to the fixing member 252 such that the housing 210 and the clamping members 250 and 260 can be fixed to a part of the user's body. The band guide member 254 may be configured such that, when the fixing member 252 is fastened to the fixing member fastening hole 253, the range of movement of the fixing member 252 is limited, thereby enabling the clamping members 250 and 260 to be forced against and clamped to a part of the user's body. The band fixing ring 255 may limit the range of movement of the clamping members 250 and 260 while the fixing member 252 and the fixing member fastening hole 253 are fastened.

Referring to FIG. 3, the electronic device 300 may include a side bezel structure 310, a wheel key 320, a front plate 201, a display 220, a first antenna 350, a second antenna 355, a support member 360 (for example, bracket), a battery 370, a printed circuit board 380, a sealing member 390, a rear plate 393, and clamping members 395 and 397. At least one of the components of the electronic device 300 may be identical or similar to at least one of the components of the electronic device 200 in FIG. 2A or FIG. 2B, and repeated descriptions thereof will be omitted herein. The support member 360 may be disposed inside the electronic device 300 and connected to the side bezel structure 310, or may be formed integrally with the side bezel structure 310. The support member 360 may be made of a metal material and/or a nonmetal (for example, polymer) material, for example. The display 220 may be coupled to a surface of the support member 360, and the printed circuit board 380 may be coupled to another surface thereof. The printed circuit board 380 may have a processor, a memory, and/or an interface mounted thereon. The processor may include, for example, at least one of a central processing device, an application processor, a graphic processing unit (GPU), an application processor, a sensor processor, or a communication processor.

The memory may include, for example, a volatile memory or a nonvolatile memory. The interface may include, for example, a high definition multimedia interface (HDMI), a universal serial bus (USB) interface, an SD card interface, and/or an audio interface. The interface may connect the electronic device 300, for example, to an external electronic device electrically or physically, and may include a USB connector, an SD card/MMC connector, or an audio connector.

The battery 370 is a device for supplying power to at least one component of the electronic device 300, and may include, for example, a primary battery that is not rechargeable, a secondary battery that is rechargeable, or a fuel cell. At least a part of the battery 370 may be disposed on substantially the same plane with the printed circuit board 380, for example. The battery 370 may be disposed integrally inside the electronic device 100, or may be disposed such that the same can be attached to/detached from the electronic device 200.

The first antenna 350 may be disposed between the display 220 and the support member 360. The first antenna 350 may include, for example, a near-field communication (NFC) antenna, a wireless charging antenna, and/or a magnetic secure transmission (MST) antenna. The first antenna 350 may wireless transmit/receive power necessary for short-range communication with an external device, for example, or power necessary for charging, and may send a short-range communication signal or a magnetically-based signal including payment data. In another embodiment, an antenna structure may be formed by a part or a combination of the side bezel structure 310 and/or the support member 360.

The second antenna 355 may be disposed between the circuit board 380 and the rear plate 393. The second antenna 355 may include, for example, a near-field communication (NFC) antenna, a wireless charging antenna, and/or a magnetic secure transmission (MST) antenna. The second antenna 355 may wirelessly transmit/receive power necessary for short-range communication with an external device, for example, or power necessary for charging, and may send a short-range communication signal or a magnetically-based signal including payment data. In another embodiment, an antenna structure may be formed by a part or a combination of the side bezel structure 310 and/or the rear plate 393.

The sealing member 390 may be positioned between the side bezel structure 310 and the rear plate 393. The sealing member 390 may be configured to block inflow of moisture and alien substances from the outside into the space surrounded by the side bezel structure 310 and the rear plate 393.

Hereinafter, an electronic device 400 according to various embodiments of the disclosure may be described with reference to the drawings. Schematic components of the electronic device 400 according to various embodiments of the disclosure may be described first.

Figure 4A:
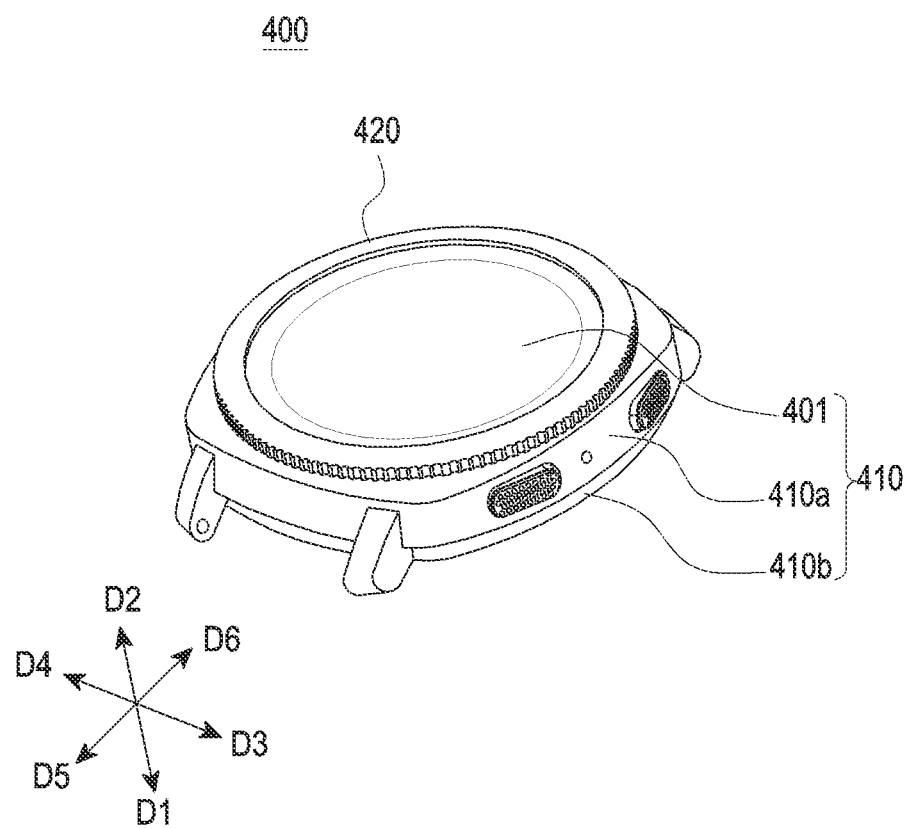
FIG. 4A is a perspective view illustrating the upper surface of an electronic device according to various embodiments of the disclosure.
Figure 4B:
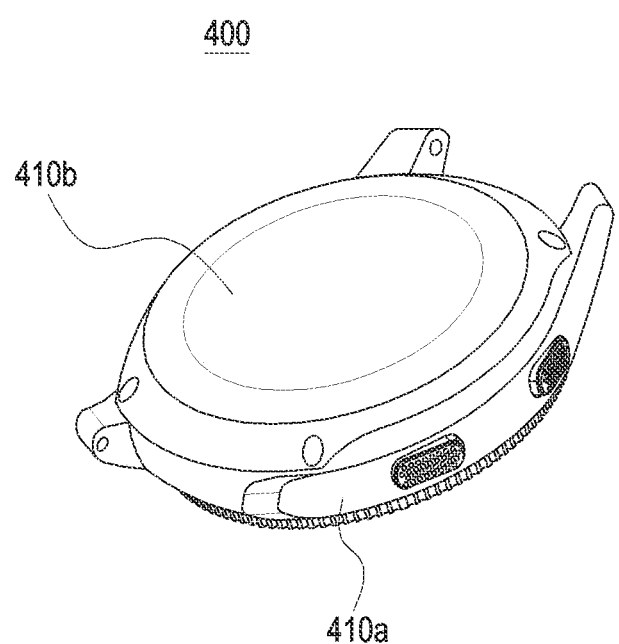
FIG. 4B is a perspective view illustrating the lower surface of an electronic device according to various embodiments of the disclosure.
Figure 5:
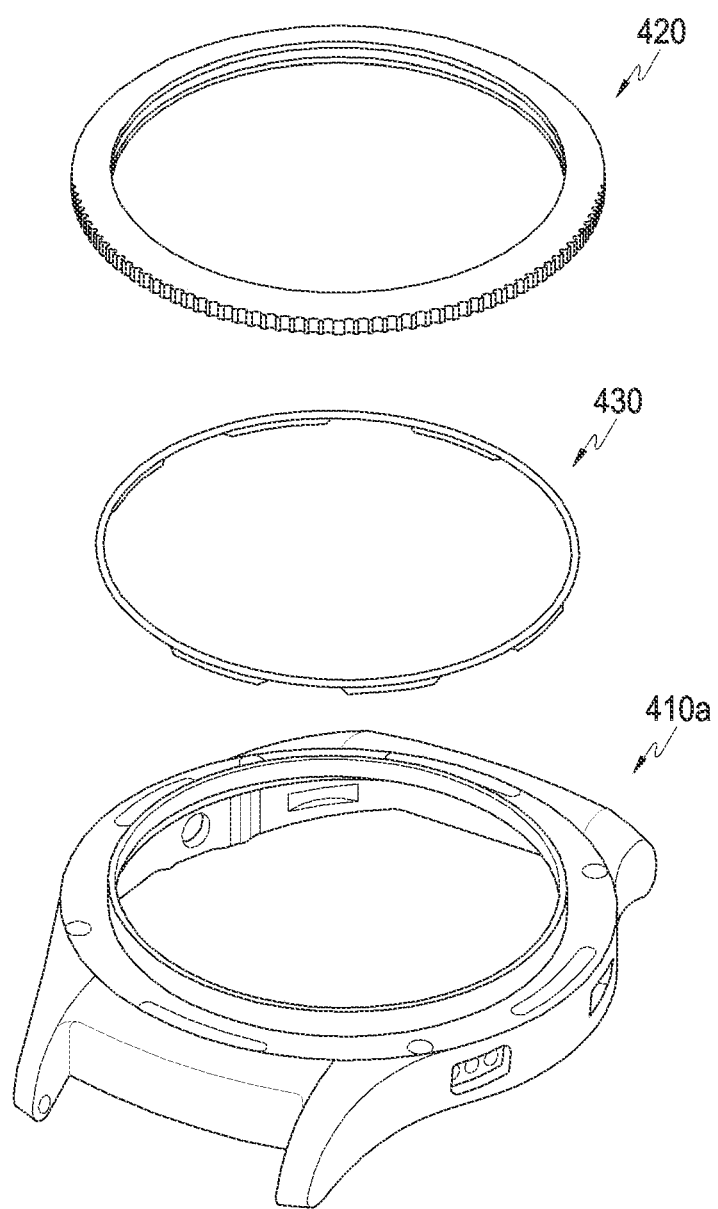
FIG. 5 is an exploded perspective view of a wheel structure, a ring structure, and a side member of an electronic device according to various embodiments of the disclosure.

FIG. 4A is a perspective view illustrating the upper surface of an electronic device 400 according to various embodiments of the disclosure. FIG. 4B is a perspective view illustrating the lower surface of an electronic device 400 according to various embodiments of the disclosure. FIG. 5 is an exploded perspective view of a wheel structure 420, a ring structure 430, and a side member 410a of an electronic device (for example, 400) according to various embodiments of the disclosure.

Referring to FIG. 4A to FIG. 5, the electronic device 400 according to various embodiments of the disclosure may include a housing 410, a wheel structure 420, and a ring structure 430.

Referring to FIG. 4A, the electronic device 400 according to various embodiments of the disclosure may include a front plate 401. At least a part of the front plate 401 may be formed to be substantially transparent, and a display portion (for example, 220) disposed beneath the front plate 401 may be exposed to the outside through the front plate 401. The wheel structure 420 according to various embodiments may be disposed to surround the periphery of the front plate 401. In addition, the wheel structure 420 may be coupled to at least a part of the side member 410a while being disposed to surround the periphery of the front plate 401.

The electronic device 400 according to various embodiments of the disclosure may include, as the housing 410, a side member 410a and a rear plate 410b. Referring to FIG. 4B, the electronic device 400 according to various embodiments may have a rear surface fabricated in an approximately flat shape. According to various embodiments of the disclosure, a rear plate (or bottom plate) 410b may be provided on the first surface of the housing 410.

Referring to FIG. 4A and FIG. 4B, the rear plate 410b may be coupled to the side member 410a so as to substantially seal the lower portion of the housing 410, thereby preventing inflow of alien substances and protecting the same from external physical impacts.

According to an embodiment, the rear plate 410b may be configured such that the same is integrally coupled to the side member 410a, or they may be coupled while being separated from each other. The interior of the housing 410 of the electronic device 400 may be opened through the rear plate 410b, and a component (for example, a battery) mounted inside the housing 410 may be replaced or repaired, for example.

The configuration of the electronic device 400 according to various embodiments of the disclosure, in which the wheel structure 420, the ring structure 430, and the side member 410a are coupled, may be schematically illustrated as in FIG. 5.

Referring to FIG. 5, the wheel structure 420 may be coupled to the ring structure 430, and the ring structure 430 may be coupled to the side member 410a. According to an embodiment, the wheel structure 420 and the ring structure 430 may have a ring shape as a whole, may be coupled to each other while having respective diameters, and may be formed such that they share a concentric circle when coupled. At least a part of the side member 410a may be formed to have a smaller diameter than the ring structure 430 such that the ring structure 430 can be seated thereon.

According to various embodiments of the disclosure, the wheel structure 420 may be a "wheel dial member" rotated by the user's manipulation so as to select various functions installed in the electronic device. According to various embodiments of the disclosure, the ring structure 430 may be a "wheel movement limiting member" configured such that, when the wheel structure 420 is mounted on the side member 410a and used accordingly, the movement of the wheel structure 420 is partially limited, thereby preventing the same from detaching from the electronic device 400. The electronic device 400 according to various embodiments of the disclosure may be described as a watch-type wearable electronic device 400, for example. The electronic device 400 illustrated in the drawings is assumed to be a watch-type wearable electronic device 400, which may correspond to an example of various embodiments of the disclosure. For example, if the electronic device (for example, 400) is a watch-type electronic device (for example, 200), the rear plate 410c may refer to a component mounted on the user's wrist so as to abut the same.

The electronic device (for example, 400) mentioned in various embodiments of the disclosure is not limited thereto, and may include any electronic device having a wheel structure 420 (for example, a smartphone having a wheel structure, a table watch-type electronic device having a wheel structure, and the like). Accordingly, not only a type of watch mounted on a wrist, but also a type of watch mounted on a different body part may correspond to an electronic device according to the disclosure, and a type of electronic device used without being mounted on a human body may also be included in the scope of various embodiments of the disclosure. The size and shape of an electronic device according to various embodiments of the disclosure is not limited to any specific embodiment.

Figure 6A:
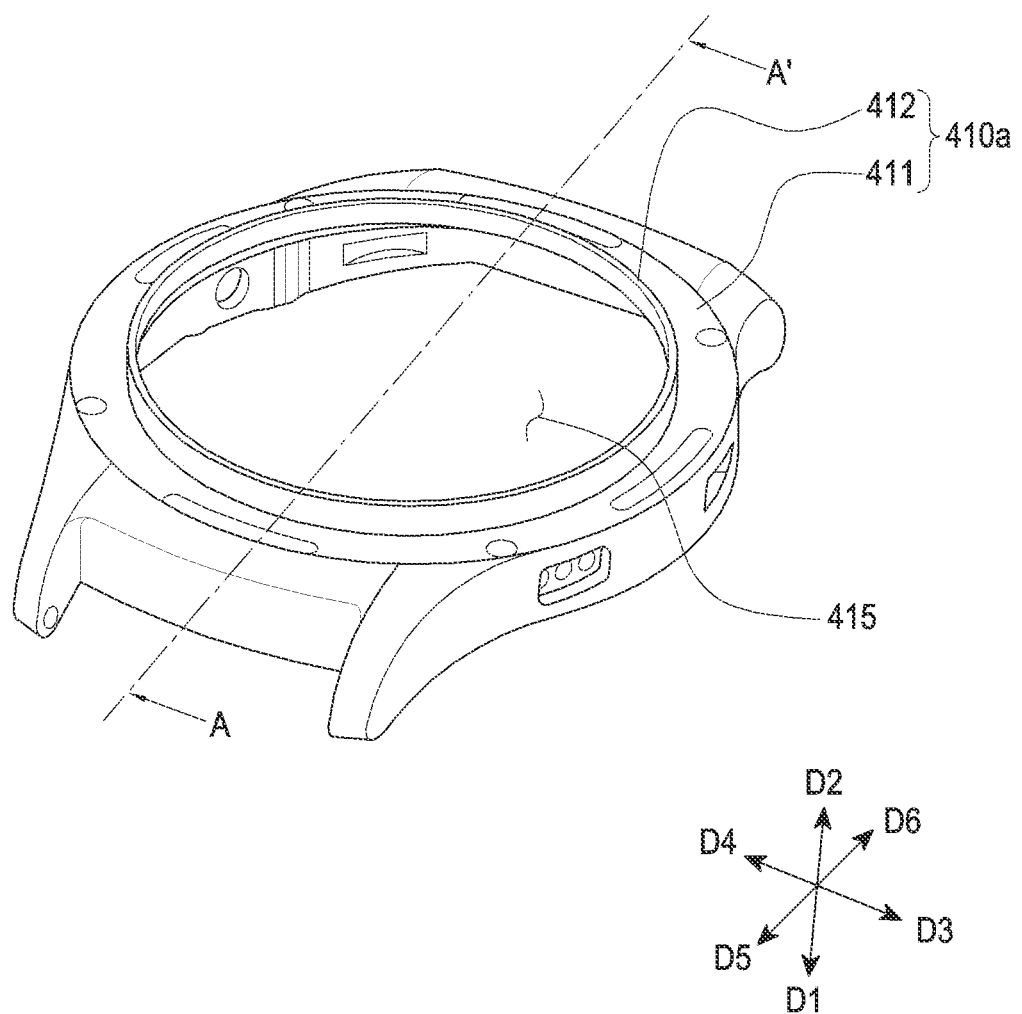
FIG. 6A is a perspective view illustrating a side member of a housing of an electronic device according to various embodiments of the disclosure.
Figure 6B:
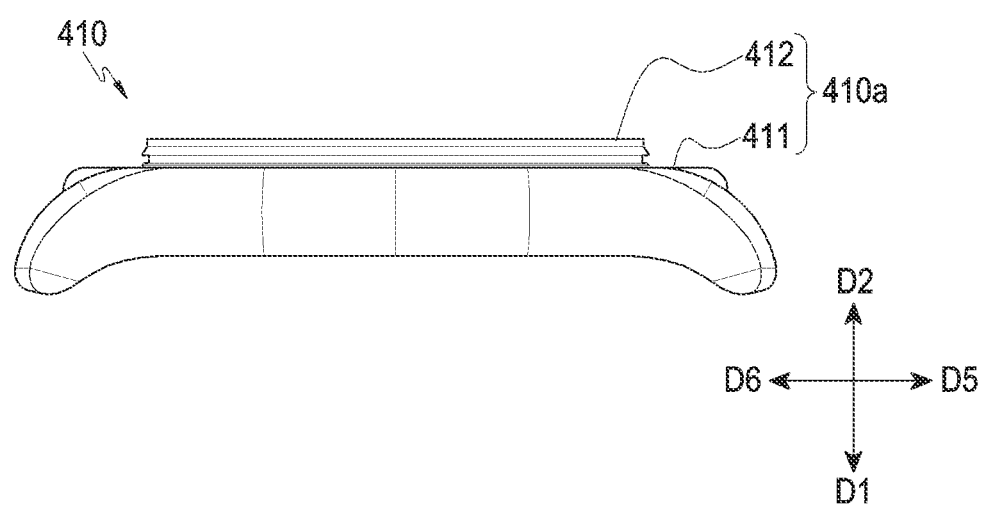
FIG. 6B is a side view illustrating a side member of a housing of an electronic device according to various embodiments of the disclosure.
Figure 6C:
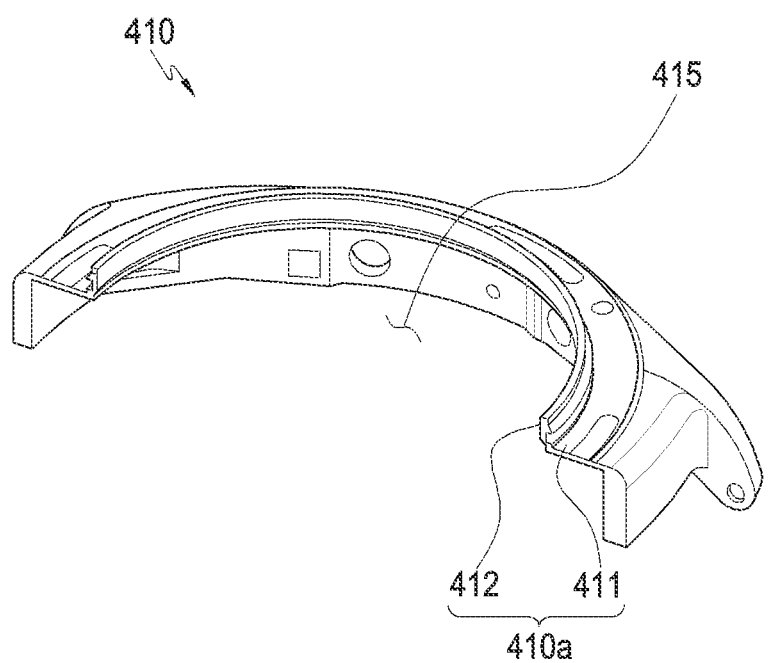
FIG. 6C is a perspective view illustrating the internal structure of a side member of a housing of an electronic device according to various embodiments of the disclosure.
Figure 6D:
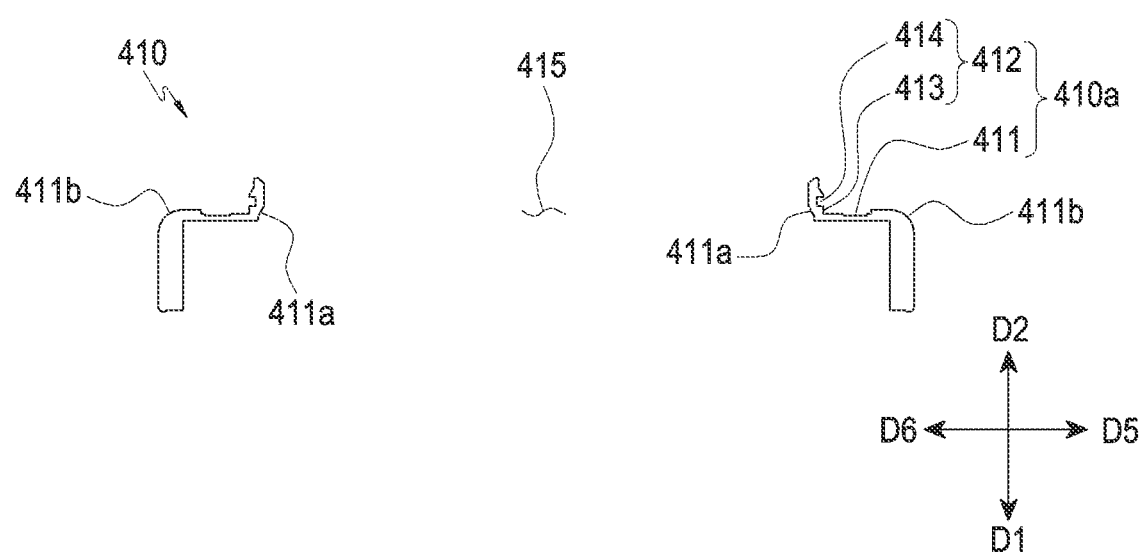
FIG. 6D is a sectional view of a side member of a housing of an electronic device according to various embodiments of the disclosure.

FIG. 6A is a perspective view illustrating a side member 410a of a housing 410 of an electronic device according to various embodiments of the disclosure. FIG. 6B is a side view illustrating a side member 410a of a housing 410 of an electronic device according to various embodiments of the disclosure. FIG. 6C is a perspective view illustrating the internal structure of a side member 410a of a housing 410 of an electronic device according to various embodiments of the disclosure. FIG. 6D is a sectional view of a side member 410a of a housing 410 of an electronic device according to various embodiments of the disclosure. FIG. 6C and FIG. 6D may illustrate sectional views taken along A-A' in FIG. 6A.

In connection with the direction components illustrated in FIG. 6A to FIG. 6D, according to various embodiments of the disclosure, direction components D1 and D2 may face in opposite directions. Direction components D3 and D4 may also face in opposite directions, and direction components D5 and D6 may face in opposite directions. According to an embodiment, direction components D1, D3, and D5 may refer to coordinate axes perpendicular to one another, respectively. In the following description, direction components D3, D4, D5, and D6 may form a virtual horizontal plane. The description that the movement of an electronic device according to various embodiments of the disclosure on a horizontal plane is limited may mean that the movement thereof in a direction parallel to the virtual horizontal plane is limited.

According to various embodiments of the disclosure, a first direction may refer to the direction component D1 or a direction parallel thereto, and a second direction may refer to the direction component D2 or a direction parallel thereto. In various embodiments, a third direction may be any direction parallel to a virtual horizontal plane extending from one of the direction components D3, D4, D5, and D6, or parallel to a virtual horizontal plane formed by at least two of the direction components D3, D4, D5, and D6. According to an embodiment, it is to be noted that, although the third direction may be described as the direction component D3 or a direction parallel thereto, the third direction does not necessarily refer to one of the direction components D3, D4, D5, and D6. In addition, as will be described, it is to be noted that the fourth direction described below does not necessarily refer to one direction of the coordinate axes.

The direction components illustrated in various embodiments of the disclosure and the drawings, including the coordinate axes included in FIG. 4A to FIG. 6D, are provided for convenience of description, and neither specify the scope of the disclosure nor limit any order.

Referring to FIG. 4A to FIG. 6D together, the housing 410 according to various embodiments of the disclosure may have a side member 410a having a predetermined thickness. The thickness as used herein may refer to a thickness in a direction parallel to a virtual horizontal plane formed by the direction components D3, D4, D5, and D6. The side member 410a may have a predetermined thickness, for example, and may include a curved surface in at least a part of the exterior thereof. According to an embodiment, the thickness of the side member 410a may be a thickness determined such that the same can include a detent groove (for example, 416 in FIG. 8) therein.

According to various embodiments, the side member 410a may include a first surface 411 and an annular protrusion 412.

According to various embodiments, the side member 410a may have a recess 415 formed therein. The recess 415 may refer to a space formed therein when the side member 410a and the rear plate 410b are coupled.

According to an embodiment, the first surface 411 may refer to a part integrally extending from an end of the side member 410a toward the recess 415. According to various embodiments, the first surface 411 may face in the second direction (for example, direction D2 or a direction parallel thereto).

In the recess 415 according to various embodiments, various mounting components, for example, at least one of a camera, a speaker, a circuit board, or various sensors may be mounted. These components may be mounted in the recess as a single module or as a combination of two or more modules. In the recess 415 according to various embodiments, a display (for example, 220) capable of displaying a screen may be mounted. At least a part of the display (for example, 220) may be exposed through a circular opening formed in the side member 410a.

The display (for example, 220) according to various embodiments may be formed to have a shape (for example, circular display) corresponding to the circular opening, for example. The circular opening may refer to a hollow space defined by the annular protrusion 412 (or circular edge portion) as illustrated in FIG. 6A, and may be a part included in the recess 415.

The annular protrusion 412 according to various embodiments of the disclosure may be formed on an end of the first surface 411, which extends from the side member 410a toward the interior of the housing 410, so as to have a predetermined height in the second direction (for example, direction D2 or a direction parallel thereto).

According to various embodiments, the side member 410a may include a first surface 411 having an inner edge 411a and an outer edge 411b. The annular protrusion 412 may protrude from the inner edge 411a in a direction parallel to the second direction.

Referring to FIG. 6D, the annular protrusion 412 may include a second surface 413 and a first extension slot 414. The second surface 413 may face in a third direction substantially perpendicular to the second direction facing away from the recess 415. The first extension slot 414 may be formed on a part of the second surface 413 near the recess 415. Accordingly, the side member 410a according to various embodiments of the disclosure may include a first surface 411 and a second surface 413. In addition, the first surface 411 may have a ring shape when the electronic device according to the disclosure is seen from above. The second surface 413 may refer to a part of a surface included in the annular protrusion 412 extending from the first surface 411. According to various embodiments, the second surface 413 may be formed perpendicularly to the first surface 411.

The annular protrusion 412 may define a circular periphery of the housing 410. According to various embodiments, the annular protrusion 412 may integrally extend from the inner edge 411a of the first surface 411. According to another embodiment, the annular protrusion 412 may be separated from the first surface 411 and configured to be coupled to the first surface 411 through a separate assembly process. According to an embodiment, the annular protrusion 412 may refer to an annular edge portion.

According to various embodiments, the first extension slot 414 may be a part formed concavely from the second surface 413. The first extension slot 414 may be formed to be elongated along the circumference of the annular protrusion 412. Although the first extension slot 414 may be formed continuously along the circumference of the annular protrusion 412 in this case, the first extension slot 414 may be formed sporadically along the circumference of the annular protrusion 412 in another embodiment.

Figure 7A:
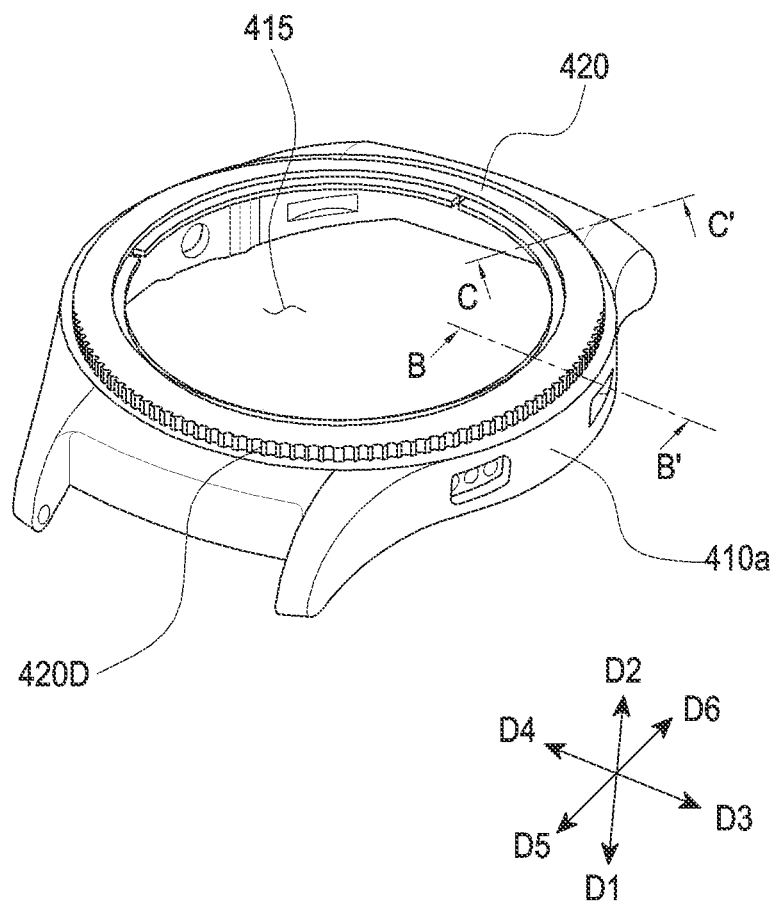
FIG. 7A is a perspective view illustrating an electronic device according to various embodiments of the disclosure, which has a wheel structure seated on a side member of a housing thereof.
Figure 7B:
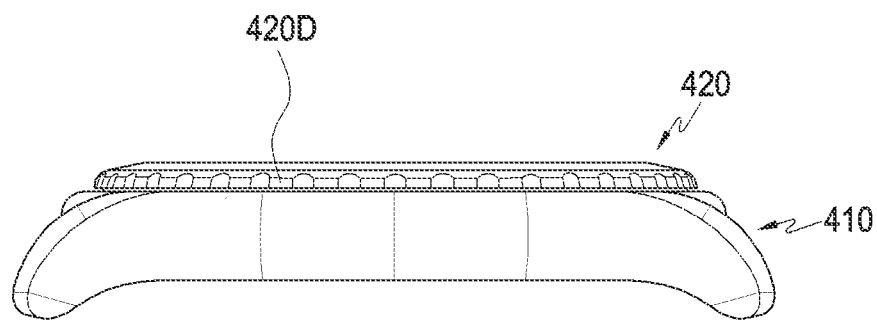
FIG. 7B is a side view illustrating an electronic device according to various embodiments of the disclosure, which has a wheel structure seated on a side member of a housing thereof.
Figure 7C:
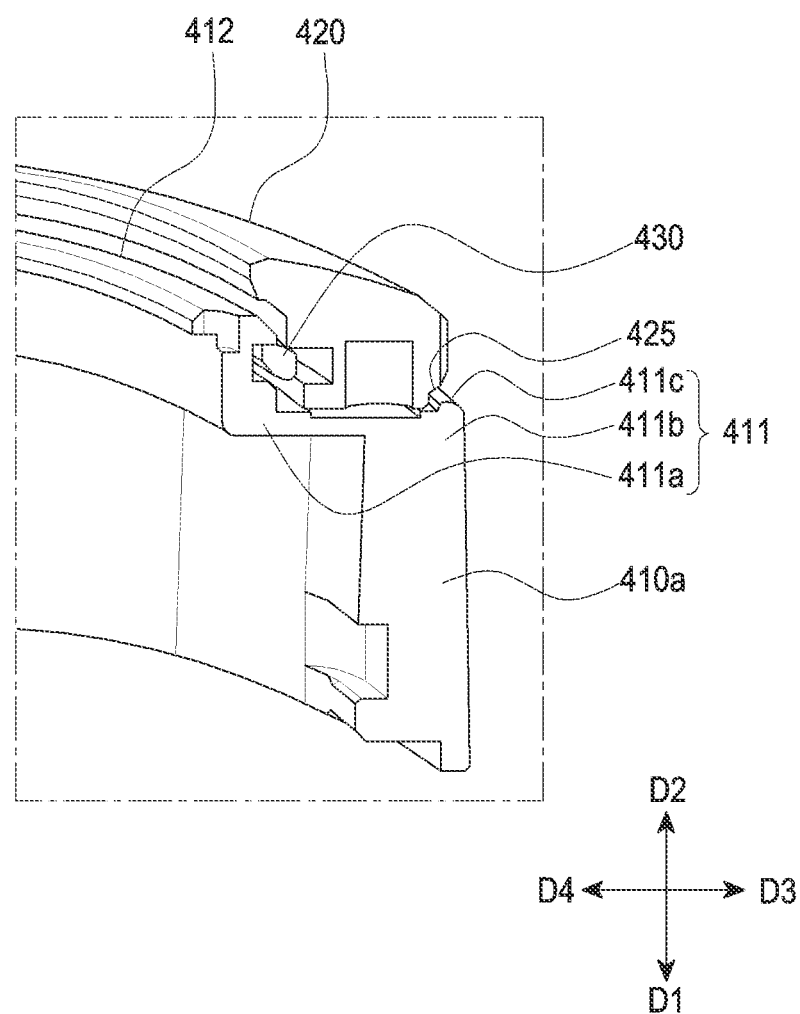
FIG. 7C is a sectional perspective view illustrating an electronic device according to various embodiments of the disclosure, which has a wheel structure seated on a side member of a housing thereof.
Figure 7D:
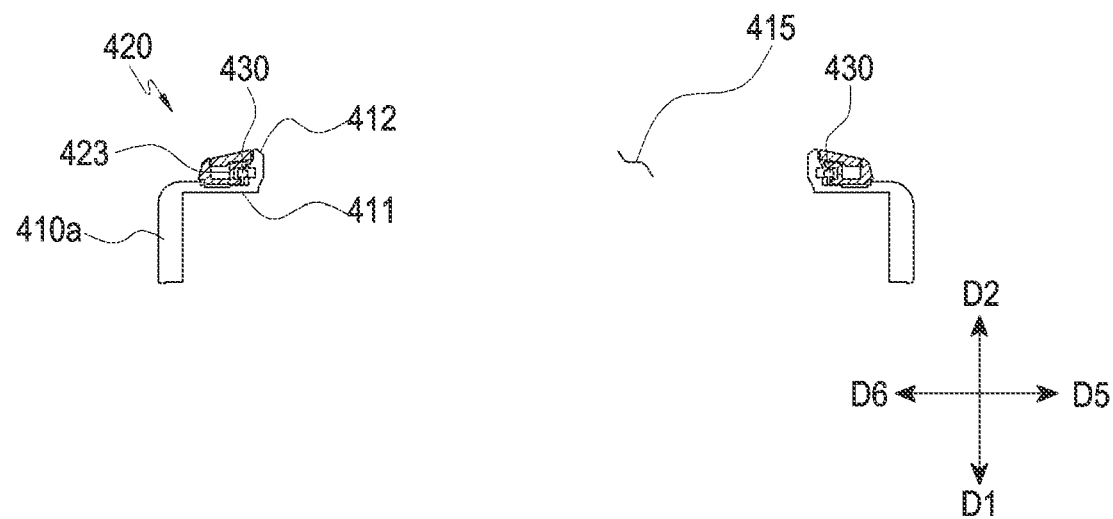
FIG. 7D is a sectional view illustrating an electronic device according to various embodiments of the disclosure, which has a wheel structure seated on a side member of a housing thereof.

FIG. 7A is a perspective view illustrating an electronic device 400 according to various embodiments of the disclosure, which has a wheel structure 420 seated on a side member 410a of a housing 410 thereof. FIG. 7B is a side view illustrating an electronic device 400 according to various embodiments of the disclosure, which has a wheel structure 420 seated on a side member 410a of a housing 410 thereof. FIG. 7C is a sectional perspective view illustrating an electronic device 400 according to various embodiments of the disclosure, which has a wheel structure 420 seated on a side member 410a of a housing 410 thereof. FIG. 7D is a sectional view illustrating an electronic device 400 according to various embodiments of the disclosure, which has a wheel structure 420 seated on a side member 410a of a housing 410 thereof.

The wheel structure 420 according to various embodiments of the disclosure may have a ring shape. The wheel structure 420 may be made of a hard material according to an embodiment.

Referring to FIG. 7A and FIG. 7B, the wheel structure 420 according to various embodiments of the disclosure may have a dot (or groove) 420D formed on the outer-diameter portion thereof so as to assign a frictional force when the user manipulates the wheel structure 420. A plurality of dots 420D may be included. For example, multiple dots 420D may be disposed at a predetermined interval along the circumferential direction of the wheel structure. The lower portion of the wheel structure 420 according to various embodiments of the disclosure may have a shape corresponding to that of the first surface 411.

For example, as illustrated in FIG. 7C and FIG. 7D, if the first surface 411 has a flat shape, the wheel structure 420 may accordingly have a flat shape.

The inner-diameter portion of the wheel structure 420 according to various embodiments of the disclosure may be seated so as to face at least a part of the annular protrusion 412 having a smaller diameter than the wheel structure 420.

The wheel structure 420 may be implemented to be able to make a 360° rotation in the clockwise direction, in the counterclockwise direction, or in both directions while the wheel structure 420 is seated on the annular protrusion 412.

The wheel structure according to various embodiments of the disclosure is configured such that, when the wheel structure 420 is disposed around the annular protrusion 412 and seated on the first surface 411, the movement thereof on a horizontal plane is limited. Referring to FIG. 7C again, in order to limit the movement on a horizontal plane, the electronic device 400 according to various embodiments of the disclosure may have a stepped portion 411c formed on the outer edge 411b of the first surface 411, and the wheel structure 420 may have an inner curved groove 425 formed thereon so as to correspond to the stepped portion 411c. If the wheel structure 420 according to various embodiments of the disclosure is seated on the housing 410, the wheel structure 420 may be substantially concentric with the annular protrusion 412. In this case, the first surface 411 is positioned below the wheel structure 420, which is blocked by the stepped portion 411c in the outward direction, such that the movement thereof may be limited.

The electronic device 400 according to various embodiments of the disclosure may be additionally configured such that the wheel structure 420 is seated to be able to rotate around the annular protrusion 412, while the movement of the wheel structure 420 in the first direction (or second direction) is limited. The electronic device 400 according to various embodiments of the disclosure may further include a ring structure 430 as the component for limiting the movement in the first direction (or second direction).

Referring to FIG. 7C, the wheel structure 420 and the annular protrusion 412 are spaced apart from each other by a predetermined distance, and a space may be formed accordingly. The ring structure 430 according to various embodiments of the disclosure may be included therebetween. The ring structure 430 according to various embodiments of the disclosure may be positioned between the wheel structure 420 and the annular protrusion 412 such that the wheel structure 420 can be seated without directly abutting the annular protrusion 412, and can be forced against the first surface 411.

Figure 8:
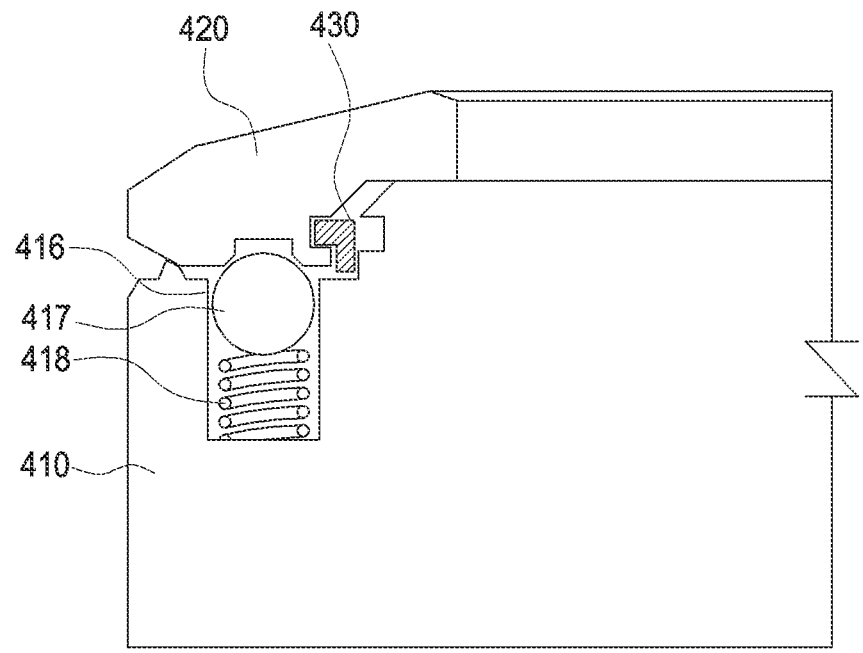
FIG. 8 is a sectional view illustrating an electronic device according to various embodiments of the disclosure, which has a ring structure disposed thereon.
Figure 9A:
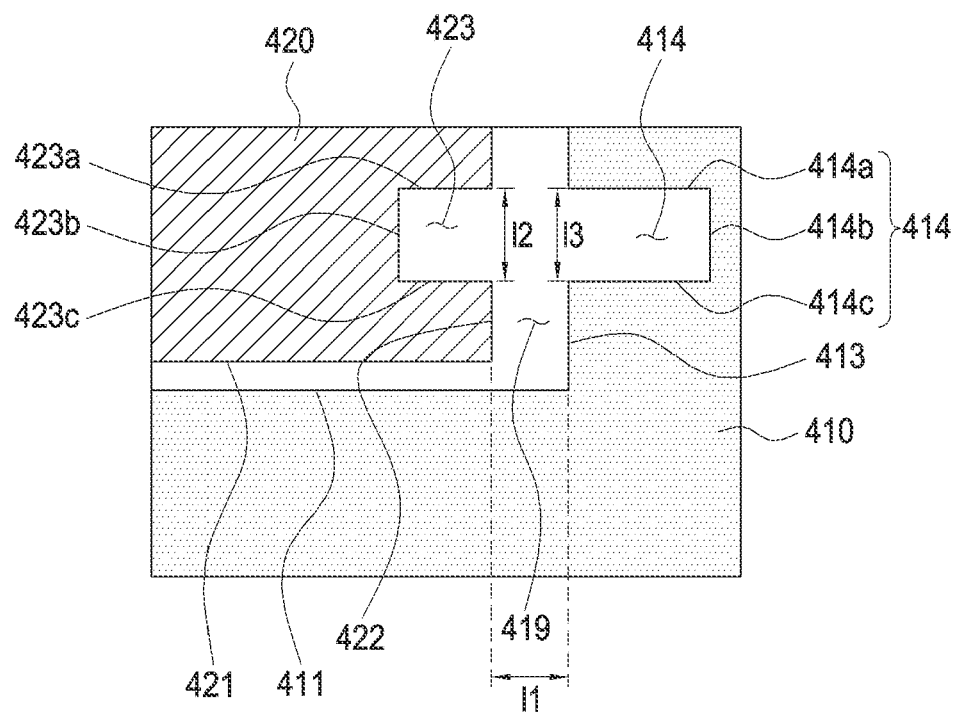
FIG. 9A is a diagram partially magnifying a wheel structure and a housing of an electronic device according to various embodiments of the disclosure.
Figure 9B:
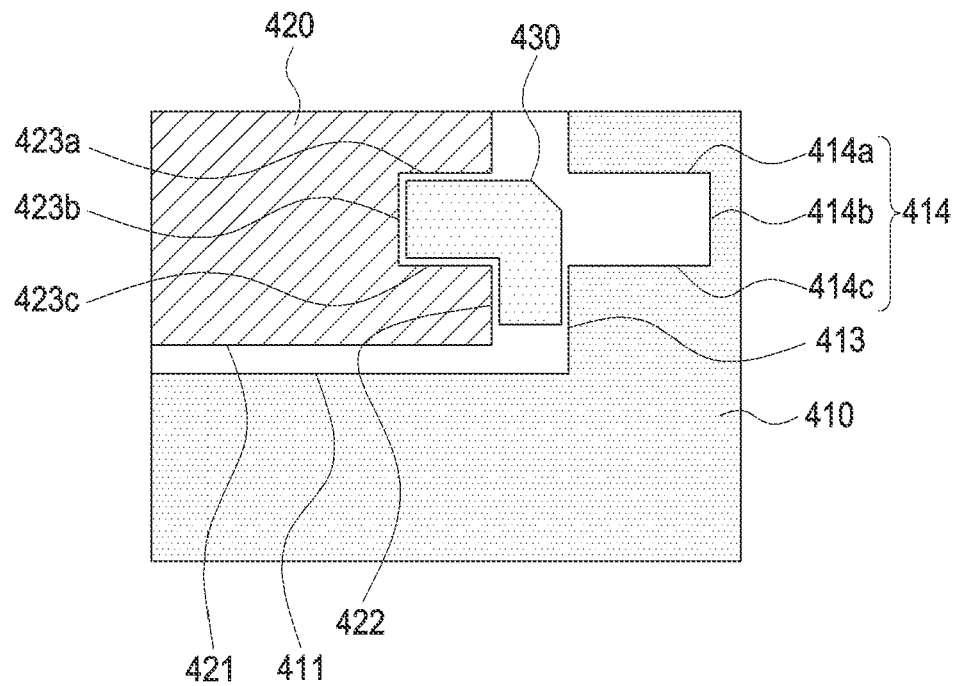
FIG. 9B is a diagram magnifying an electronic device according to various embodiments of the disclosure, which has a ring structure disposed between a wheel structure and a housing.

FIG. 8 is a sectional view illustrating an electronic device 400 according to various embodiments of the disclosure, which has a ring structure 430 disposed thereon. FIG. 9A is a diagram partially magnifying a wheel structure 420 and a housing 110 of an electronic device according to various embodiments of the disclosure. FIG. 9B is a diagram magnifying an electronic device according to various embodiments of the disclosure, which has a ring structure 430 disposed between a wheel structure 420 and a housing 110.

Referring to FIG. 8, FIG. 9A, and FIG. 9B together, the wheel structure 420 according to various embodiments may include a first inner surface 421 facing the first surface 411, a second inner surface 422 facing the second surface 413, and a second extension slot 423 formed on the second inner surface 422 near the recess.

According to an embodiment, the description that the second extension slot 423 is formed on the second inner surface 422 near the recess may mean that the same is formed to face the outer-dimeter surface of the annular protrusion 412.

The wheel structure 420 according to various embodiments may be seated on the periphery of the housing 410 such that the first inner surface 421 and the second inner surface 422 face the first surface 411 and the second surface 413, respectively.

The housing 110 of the electronic device 400 may have a first detent groove 416, and a member for applying an elastic force, such as a detent spring 418, and a detent ball 417 supported thereby, for example, may be disposed therein.

Referring back to FIG. 9A, the second extension slot 423 according to various embodiments may be formed in a position in which the same corresponds to the first extension slot 414 formed on the annular protrusion 412.

According to various embodiments, the first extension slot 414 may be formed concavely on the second surface 413 of the annular protrusion 412 towards the recess 415 directed to the center of the annular protrusion 412. The first extension slot 414 may be a space formed by a first top surface 414a, a first inner peripheral surface 414b, and a first bottom surface 414c. The first inner peripheral surface 414b may face in a direction parallel to the direction in which the second surface 413 faces.

According to various embodiments, the second extension slot 423 may be formed concavely on the second inner surface 422 of the wheel structure 420 away from the recess 415. The second extension slot 423 may be a space formed by a second top surface 423a, a second inner peripheral surface 423b, and a second bottom surface 423c. The second inner peripheral surface 423b may face the first inner peripheral surface 414b.

According to various embodiments of the disclosure, a predetermined gap 419 may be formed between the second surface 413 and the second inner surface 422 as illustrated in FIG. 9A. As will be described later, a ring structure 430 according to various embodiments of the disclosure may be disposed in the gap 419 such that, when a wheel structure 420 is rotatably seated on the housing 410, movements of the wheel structure 420 from the housing 410 in the horizontal direction and/or vertical direction can be limited.

Although the first extension slot 414 and the second extension slot 423 according to various embodiments of the disclosure have been described, the specific structure and shape of the first extension slot 414 and the second extension slot 423 are not limited to the shapes illustrated in the drawings and described above.

For example, according to various embodiments, the first extension slot 414 and the second extension slot 423 in FIG. 9A may have a difference in height in the second direction (for example, D2 in FIG. 4A or direction parallel to D2). Alternatively, the interval l2 between the first top surface 414a and the first bottom surface 414c and the interval l3 between the second top surface 423a and the second bottom surface 423c may be modified according to the dimension of the ring structure 430 (described later). Alternatively, the size l1 of the gap 419 between the second surface 413 and the second inner surface 422 may be modified as desired according to the dimension of the ring structure 430. Referring to FIG. 9B, a ring structure 430 may be disposed between the annular protrusion 412 on which the first extension slot 414 is formed and the wheel structure 420 on which the second extension slot 423 is formed. According to various embodiments, a part of the ring structure 430 may be inserted into the second extension slot 423, and another part of the ring structure 430 may be inserted into the first extension slot 414. In addition, still another part of the ring structure 430 may be disposed in the gap 419. In an embodiment, a part of the ring structure 430 and another part thereof may be inserted together into the second extension slot 423 and the gap 419, as illustrated in FIG. 9B.

According to an embodiment, the first extension slot 414 and the second extension slot 423 may have U-shaped sections, but are not necessarily limited thereto according to various embodiments of the disclosure. According to an embodiment, the first extension slot 414 and the second extension slot 423 may have various shapes according to the shape of the ring structure 430 fastened thereto.

Figure 10:
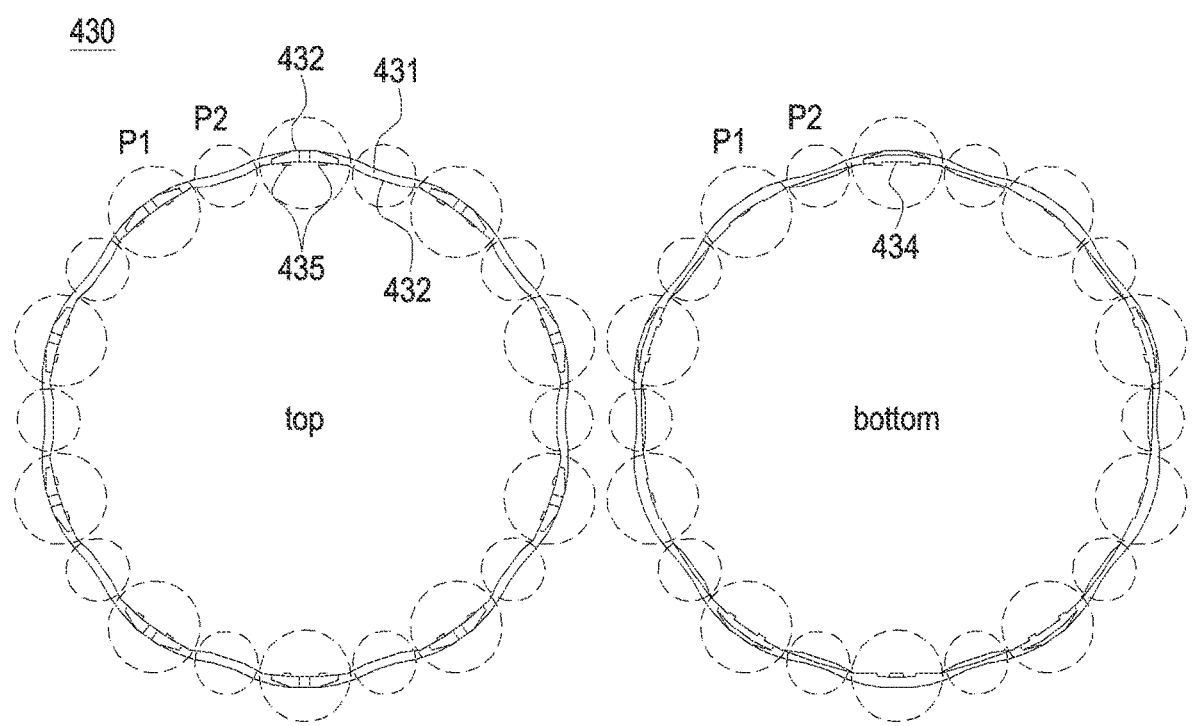
FIG. 10 is a diagram illustrating a ring structure of an electronic device according to various embodiments of the disclosure when viewed from above and below, respectively.

FIG. 10 is a diagram illustrating a ring structure 430 of an electronic device 400 according to various embodiments of the disclosure when viewed from above and below, respectively.

The ring structure according to various embodiments of the disclosure may include a plurality of portions partially inserted into the first extension slot (for example, 414) and partially inserted into the second extension slot (for example, 423), respectively.

The ring structure 430 according to various embodiments of the disclosure may include a body 431, a first portion 432, a second portion 433, and a third portion 434. The plurality of portions mentioned above may correspond to the first portion 432, the second portion 433, and the third portion 434. The first portion 432, the second portion 433, and the third portion 434 may be configured to protrude from the body 431 of the ring structure 430. The first portion 432, the second portion 433, and the third portion 434 may protrude away from the body 431 when seen on a section of the ring structure 430. As will be described later, the ring structure 430 may include a plurality of protrusions 435 protruding toward the center of the ring structure 430. According to an embodiment, the plurality of protrusions 435 may correspond to parts protruding separately from the plurality of portions. According to various embodiments of the disclosure, the body 431 may be a part forming the overall contour of the ring structure 430. The body 431 according to various embodiments of the disclosure may have a ring shape. The ring-shaped body 431 may have the shape of a closed loop, or may be partially cut such that an end thereof and another end thereof substantially face each other. The first portion 432, the second portion 433, and the third portion 434 may be configured to protrude from the body 431 in different directions, respectively.

According to various embodiments, the first portion 432 and the second portion 433 may be disposed in different sections along the circumference of the body 431. Referring to FIG. 10, the ring structure 430 according to various embodiments of the disclosure may be divided into at least two divided sections (for example, P1 and P2) along the circumference of the body 431. For example, assuming that the ring structure 430 is divided into two divided sections (for example, P1 and P2), the divided sections may be aligned regularly/irregularly along the circumference of the body 431. For example, as illustrated in FIG. 10, the section P1 and the section P2 may be disposed alternately with each other. According to an embodiment, the first portion 432 may be positioned in the section P2, and the second portion 433 may be positioned in the section P1. According to various embodiments, the third portion 434 may be positioned in one of the at least two divided sections, for example, in the section P1 or section P2. According to an embodiment, the third portion 434 may be positioned in the same section (for example, P1) as the second portion 433. According to an embodiment, if the second portion 433 and the third portion 434 are positioned in the same section (for example, P1), the second portion 433 and the third portion 434 may protrude from the body 431 in different directions when seen on a section of the ring structure 430 (for example, the second portion 433 may protrude in a direction parallel to the direction component D3, and the third portion 434 may protrude in a direction parallel to the direction component D1).

If the ring structure 430 according to various embodiments of the disclosure is configured to be interposed between the wheel structure 420 and the annular protrusion (for example, 412), the diameter of the body 431 may be smaller than the outer diameter of the wheel structure 420 and larger than that of the annular protrusion 412. As another example, the ring structure 430 may be formed to straddle the outside and inside of the annular protrusion (for example, 412). In this case, the diameter of the body 431 may be smaller than the outer diameter of the wheel structure 420.

The ring structure 430 according to various embodiments of the disclosure may be molded such that the thickness thereof is small compared with the circumferential length thereof. The ring structure 430 may be elastically deformed and bent. Accordingly, while the wheel structure 420 rotates around the annular protrusion (for example, 412), the ring structure 430 may press the wheel structure 420 against the housing 410, thereby preventing the wheel structure 420 from detaching from the housing 410. In another embodiment, the wheel structure 420 may be coupled to the annular protrusion (for example, 412) by using the elasticity of the ring structure 430.

As will be described later, the sectional shape of the ring structure 430 according to various embodiments of the disclosure may be differently formed according to the circumferential length of the wheel structure 420. For example, a part of the section of the ring structure 430 may have an L-shape, another part thereof may have a rectangular shape, and still another part thereof may have a hook shape. The sectional shape of the ring structure 430 may be differently formed according to the circumference of the ring structure 430, and may be formed repeatedly.

The ring structure 430 according to various embodiments of the disclosure may be provided such that the material thereof can elastically deform. For example, the ring structure 430 according to various embodiments of the disclosure may be made of a polymeric material. The polymeric material may include at least one of polyoxymethylene, polyacetal, acetal resin, and polyamide. According to the material characteristics of the ring structure 430, durability against impacts during a rotation of the wheel structure 420 may be secured, and noise and the like resulting from friction during the rotation may be minimized.

Figure 11:
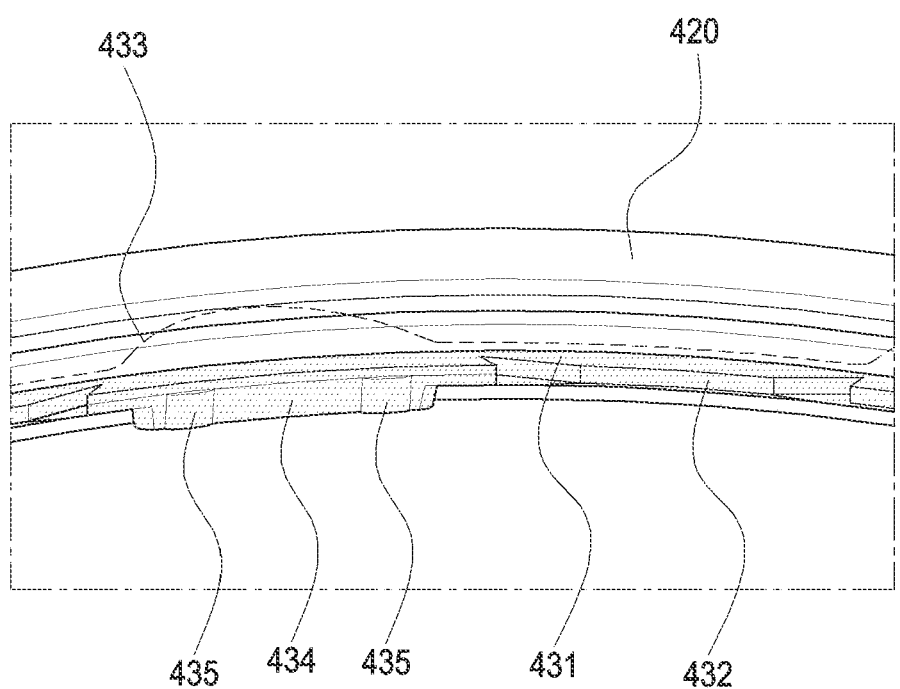
FIG. 11 is a diagram illustrating an electronic device according to various embodiments of the disclosure, when a ring structure is fastened to a wheel structure.

FIG. 11 is a diagram illustrating the electronic device (for example, 400) according to various embodiments of the disclosure, when the ring structure 430 is fastened to the wheel structure 420.

According to various embodiments of the disclosure, the body 431 may have a plurality of portions (hereinafter, referred to as "first portion 432, second portion 433, and third portion 434") formed at a predetermined interval from each other on the inside, outside, and one surface (lower surface) thereof. One of the plurality of portions may be inserted into the first extension slot 414, another portion may be inserted into the second extension slot 423, and still another portion may be inserted into the gap 419 between the second surface 413 and the second inner surface 422.

According to various embodiments, the first portion 432 and the second portion 433 may protrude from different parts of the body 431, respectively. According to an embodiment, the third portion 434 may protrude from a different part of the body 431 than the first portion 432 or the second portion 433. The description that portions protrude from different parts may mean that they protrude from different parts along the circumference of the body 431. It is to be noted that, as will be described later, the second portion 433 and the third portion 434 may protrude in different directions from the same part of the body 431 along the longitudinal direction of the circumference thereof, in another embodiment.

The first and second portions 432 and 433 according to various embodiments of the disclosure may be provided such that the wheel structure 420 can be rotatably fixed to the housing 410, and may prevent the wheel structure 420 from separating or moving in a direction perpendicular to the housing 410 (upward/downward direction). For reference, the description that "the wheel structure 420 is rotatably fixed to the housing 410" may mean that, although the rotation of the wheel structure 420 is not limited by any specific component, movements other than the rotation (for example, vertical and/or horizontal movements) are limited. In an embodiment, the third portion 434 may be provided such that, when the wheel structure 420 is mounted on the housing 410, the housing 410 is prevented from moving in the horizontal direction.

Figure 12:
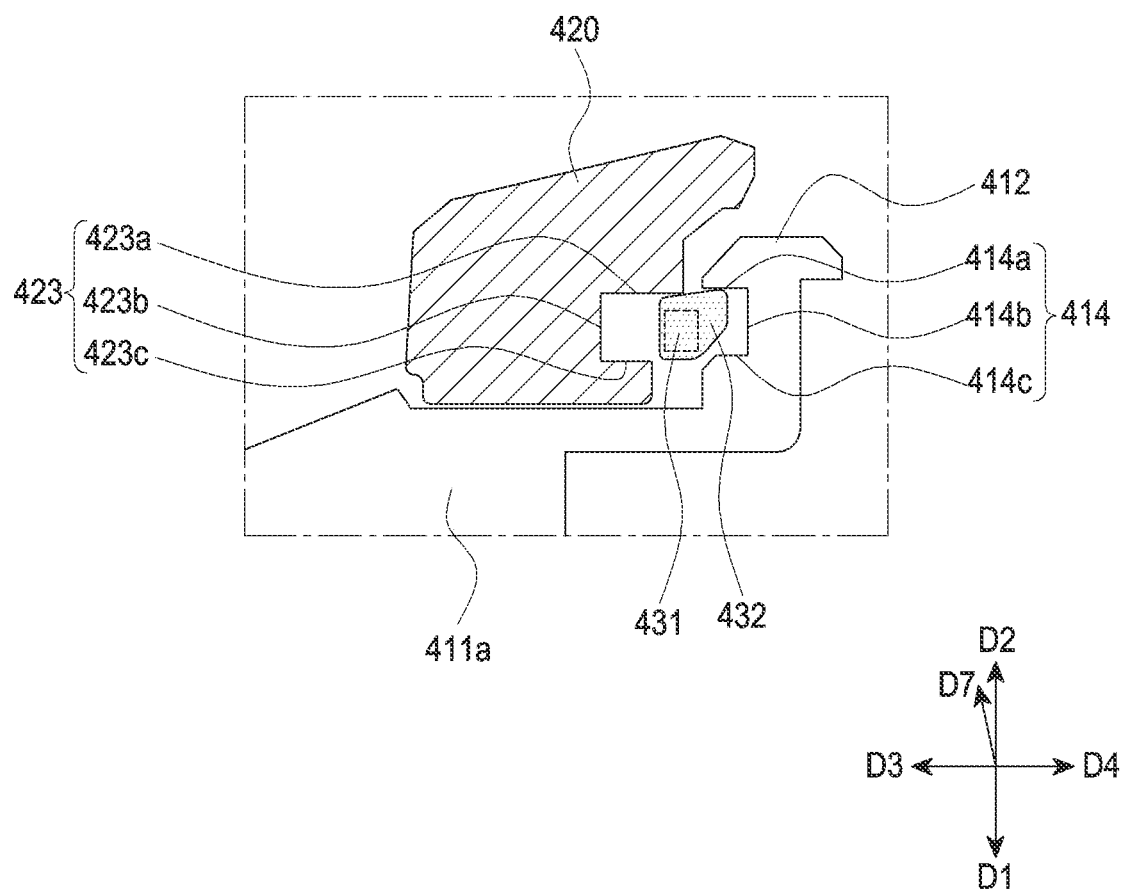
FIG. 12 is a sectional view of an electronic device according to various embodiments of the disclosure, wherein a first portion is disposed between a wheel structure and an annular protrusion.

FIG. 12 is a sectional view of the electronic device (for example, 400) according to various embodiments of the disclosure, wherein the first portion 432 of the ring structure (for example, 430) is disposed between the wheel structure 420 and the annular protrusion 412.

According to various embodiments of the disclosure, the first portion 432 may protrude in the fourth direction from the body 431 such that the same is seated in the first extension slot 414. Referring to FIG. 12, the first portion 432 according to an embodiment may be configured to protrude from the body 431 obliquely (or upwards) toward the annular protrusion 412. According to an embodiment, a virtual normal line extending from the upper surface of the first portion 432 may be formed parallel to the direction component D7 illustrated in FIG. 12. The direction component D7 may form various angles (for example, 5° to 45°) with regard to the direction component D2.

According to various embodiments, a plurality of first portions 432 may be provided so as to be spaced apart from each other along the inner periphery of the ring-shaped body 431 and so as to protrude upwards from the body 431 in the inward direction. If the ring structure (for example, 430) is coupled to the annular protrusion 412, the first portions 432 may be inserted into the first extension slot 414 of the annular protrusion 412. If the first portions 432 are inserted into the first extension slot 414, the ring structure 430 may be coupled to the housing 410. Therefore, the ring structure 430 may not detach from the housing 410 as long as no separate external force is applied thereto. Referring to back to FIG. 12, at least a part of the ring structure 430 may contact the first extension slot 414, and another part of the ring structure 430 than the part contacting the first extension slot 414 may contact the second extension slot 423. For example, the upper surface of the first portion 432 may contact the top surface 414a of the first extension slot 414, and the upper surface of the body 431 may contact the second top surface 423a of the second extension slot 423.

Figure 13:
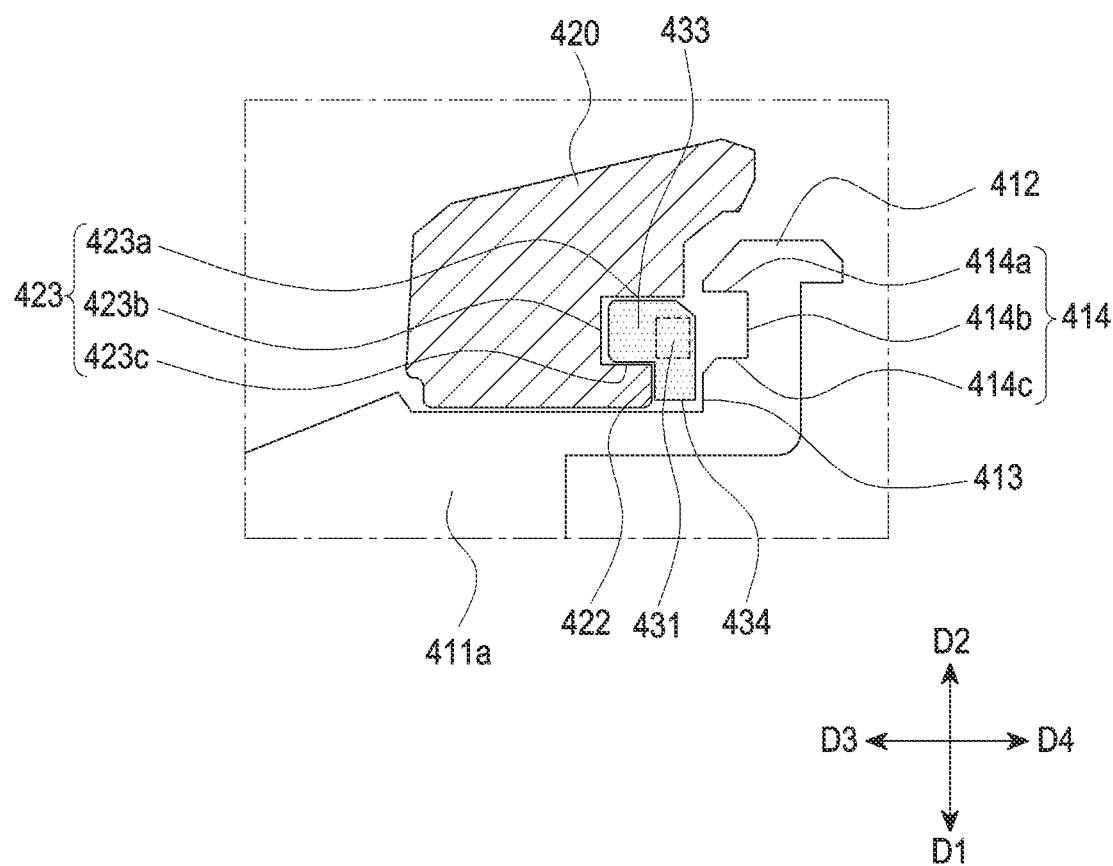
FIG. 13 is a sectional view of an electronic device according to various embodiments of the disclosure, wherein a second portion is disposed between a wheel structure and an annular protrusion.
Figure 14:
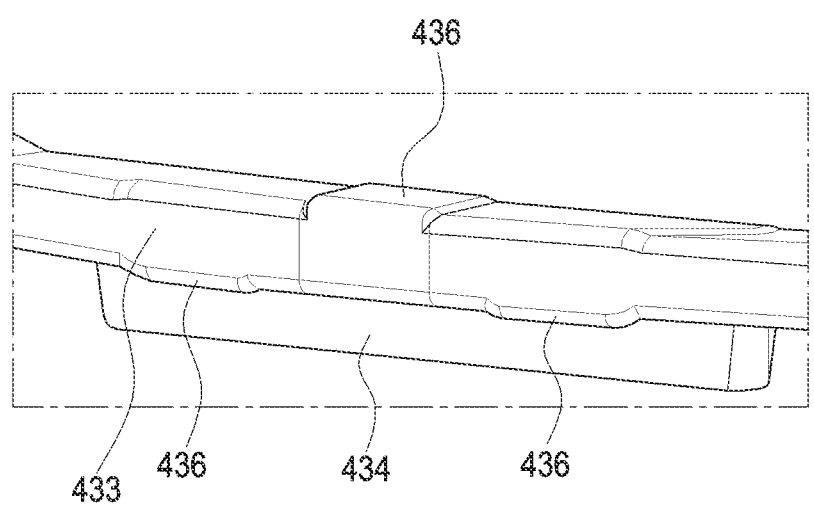
FIG. 14 is a perspective view of an electronic device according to various embodiments of the disclosure, which has a corrugation formed on a second portion thereof.

According to various embodiments, since the first portion 432 protrudes upwards from the body 431, the upper surface of the first portion 432 may be positioned higher than the upper surface of the body 431, when seen on a section of the ring structure 430. When the ring structure 430 is coupled in this manner, the top surface 414a of the first extension slot 414 and the top surface 423a of the second extension slot 424 may form a stepped portion. As will be described later, the wheel structure 420 may be pressed in the downward direction (for example, D1 or direction parallel to direction D1) by the ring structure 430 such that the top surface 423a of the second extension slot 414 is maintained at a height lower than the height of the top surface 414a of the first extension slot 414. FIG. 13 is a sectional view of the electronic device (for example, 400) according to various embodiments of the disclosure, wherein the second portion 433 of the ring structure (for example, 430) is disposed between the wheel structure 420 and the annular protrusion 412. FIG. 14 is a perspective view of the electronic device (for example, 400) according to various embodiments of the disclosure, which has a corrugation 436 formed on the second portion 433.

Figure 15:
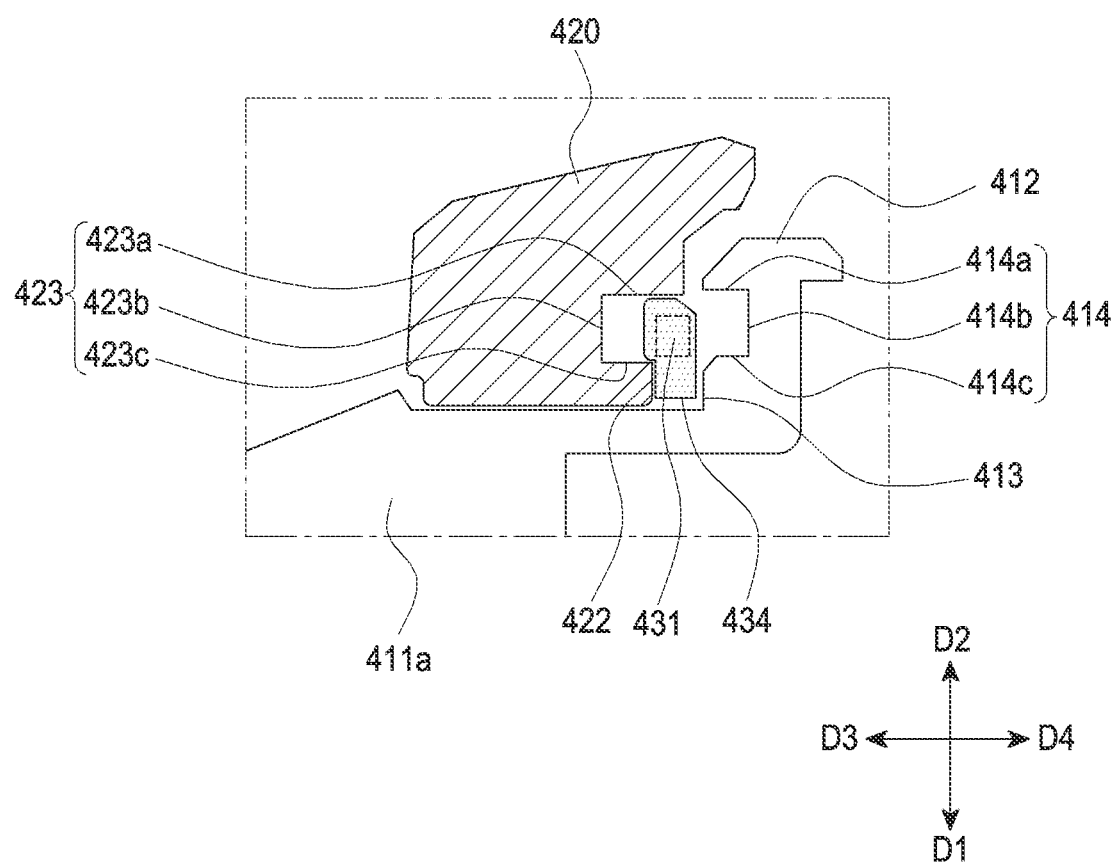
FIG. 15 is a sectional view of an electronic device according to various embodiments of the disclosure, wherein a third portion of a ring structure is disposed between a wheel structure and an annular protrusion.

FIG. 15 is a sectional view of the electronic device (for example, 400) according to various embodiments of the disclosure, wherein the third portion 434 of the ring structure (for example, 430) is disposed between the wheel structure 420 and the annular protrusion 412.

Referring to FIG. 13, the second portion 433 according to various embodiments of the disclosure may be provided to protrude from the body 431 in the third direction (for example, D3 or direction parallel to D3) and to be seated in the second extension slot 423. A plurality of second portions 433 may be provided to be spaced apart from each other by a predetermined interval along the outer periphery of the body 431 and so as to protrude toward the outside of the body 431.

According to various embodiments, in the process of coupling a ring structure (for example, 430) to the wheel structure 420, the second portions 433 may be inserted into the second extension slot 423 of the wheel structure 420. If the second portions 433 are inserted into the second extension slot 423, the body 431 may be fixed to the wheel structure 420, or at least the movement thereof may be limited.

According to various embodiments, as illustrated in FIG. 12 and FIG. 13, no second portion 433 may be formed in the section (for example, section P2) of the body 431, in which the first portion 432 is formed. According to an embodiment, no first portion 432 may be formed in the section (for example, section P1) of the body 431, in which the second portion 433 is formed. Therefore, a space may be formed between the first portion 432 and the second extension slot 423, and a part of the body 431 of the first portion 432 may move through the space in the direction D3 (or direction parallel to D3) or D4 (or direction parallel to D4).

Referring to FIG. 14, the second portion 433 according to various embodiments of the disclosure may be inserted into the second extension slot 423, and may have a corrugation 436 formed on the outer peripheral portion thereof. According to various embodiments, the ring structure (for example, 430) may slip when the wheel structure (for example, 420) rotates. According to an embodiment, the second portion 433 may have a corrugation 436 formed thereon such that the second portion 433 is fully fitted into/supported by the second extension slot 423. Therefore, according to an embodiment, unlike the first portion 432 configured such that a part of the body 431 thereof can move forwards/backwards in the direction D3 (or direction parallel to D3) or D4 (or direction parallel to D4), the second portion 433 may be fully fitted into/supported by and fixed to the second extension slot 423 by the corrugation 436. According to various embodiments, the corrugation 436 may be formed on the upper and lower surfaces of the second portion 433 as illustrated in FIG. 14. Alternatively, the corrugation 436 may be formed to have a wedge shape such that the ring structure 430 is inserted smoothly when assembled to the wheel structure 420, but is not easily disassembled without applying a predetermined degree of force when disassembled. However, this is only an embodiment, and the size, shape, and disposition of the corrugation are not limited to any embodiment. Referring back to FIG. 13, the third portion 434 according to various embodiments of the disclosure may be provided in the same position as the second portion 433 or in a close position, along the circumference of the body 431. For example, the third portion 434 and the second portion 433 may be formed together in the divided section P1 of the body 431 referred to in FIG. 10. According to an embodiment, the third portion 434 may protrude in a direction (for example, D1 or direction parallel to D1) perpendicular to the second portion 433.

According to various embodiments, a surface of the third portion 434 may face the second inner surface 422 of the wheel structure 420, and another surface thereof may face the second surface 413. Unlike the first portion 432 and the second portion 433, each of which has a substantial space formed on a surface thereof, the third portion 434 may be configured to be tightly contacted the second inner surface 422 and the second surface 413. Therefore, when the wheel structure 420 is seated on the housing (for example, 410), the movement of the wheel structure 420 in the horizontal direction (for example, D3 or D4) may be limited by the third portion 434.

Accordingly, the third portion 434 may be seated in the gap (for example, 419) formed between the wheel structure 420 and the annular protrusion 412, and when the wheel structure 420 is seated on the housing (for example, 410), the interval between the wheel structure 420 and the housing (for example, 410) is reduced, thereby preventing the wheel structure 420 from moving in the horizontal direction (for example, D3 or D4) of the housing (for example, 410).

Referring to FIG. 15, the third portion 434 according to various embodiments may be provided in a different position from the position in which the second portion (for example, 433) is provided, along the circumference of the body 431. According to an embodiment, the first portion (for example, 432), the second portion (for example, 433), and the third portion 434 may protrude in different positions, respectively, along the circumference of the body 431.

Figure 16:
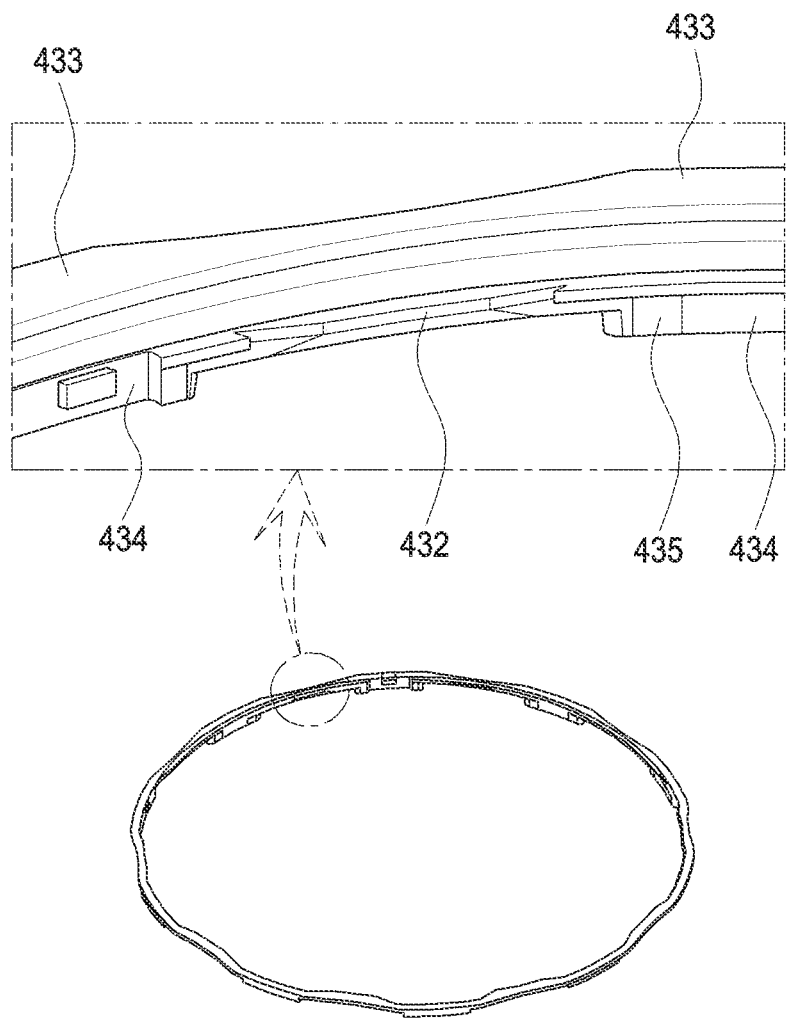
FIG. 16 is a perspective view of a ring structure of an electronic device according to various embodiments of the disclosure, together with a magnified perspective view illustrating the relation of disposition of portions included therein.

FIG. 16 is a perspective view of a ring structure (for example, 430) of an electronic device (for example, 400) according to various embodiments of the disclosure, together with a magnified perspective view of a ring structure (for example, 430) illustrating the relation of disposition of portions included therein.

Figure 17:
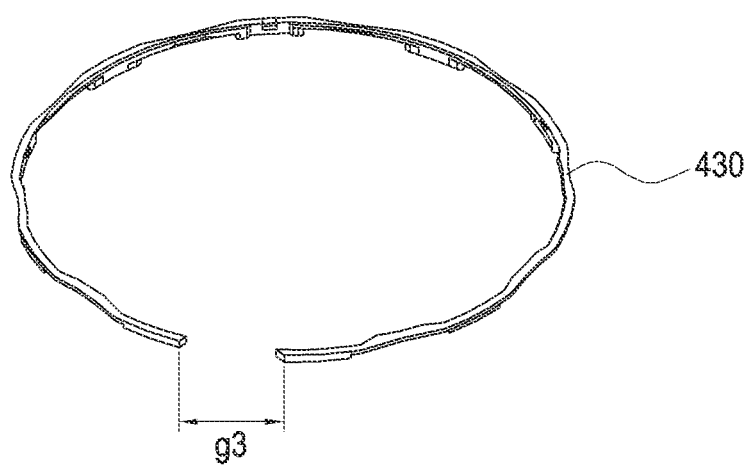
FIG. 17 is a diagram illustrating an electronic device according to various embodiments of the disclosure, wherein an end of a ring structure and another end thereof are spaced apart.

FIG. 17 is a diagram illustrating the electronic device (for example, 400) according to various embodiments of the disclosure, wherein an end of the ring structure 430 and another end thereof are spaced apart.

According to various embodiments, the second portion 433 may be formed to intersect with the position in which the first portion 432 is formed, along the circumferential direction of the body 431. The shape of intersection between the second portion 433 and the first portion 432 may be repeatedly formed through the entire ring structure (for example, 430) along the circumferential direction of the body 431.

According to various embodiments, the ring structure (for example, 430) may be provided such that the wheel structure (for example, 420) is seated on the housing (for example, 410), and the housing 410 is prevented from moving in the vertical and horizontal directions. Referring to FIG. 16, the ring structure (for example, 430) according to various embodiments of the disclosure may be configured such that the first portion 432 and the second portion 433 are disposed alternately along the longitudinal direction of the circumference of the body 431, and the third portion 434 is formed to protrude downwards in the position on the body 431 in which the second portion 433 is formed. Such a shape may be repeatedly formed in the entire ring structure.

Referring to FIG. 17, the ring structure 430 is illustrated in such a shape that a part thereof is cut, not in the shape of a closed curve. According to various embodiments of the disclosure, the ring structure 430 may be formed such that an end thereof and another end thereof are spaced apart by a predetermine distance (for example, g3), and such that in the process of coupling the ring structure 430 to the wheel structure 420, an end of the ring structure 430 and another end thereof meet.

Figure 18:
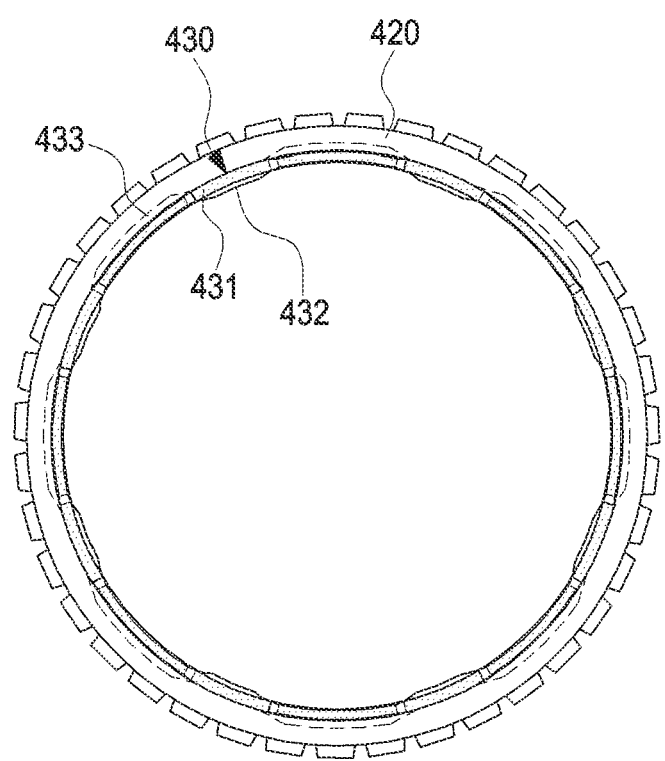
FIG. 18 is a diagram schematically illustrating an electronic device according to various embodiments of the disclosure, wherein a ring structure is fastened to a wheel structure.
Figure 19:
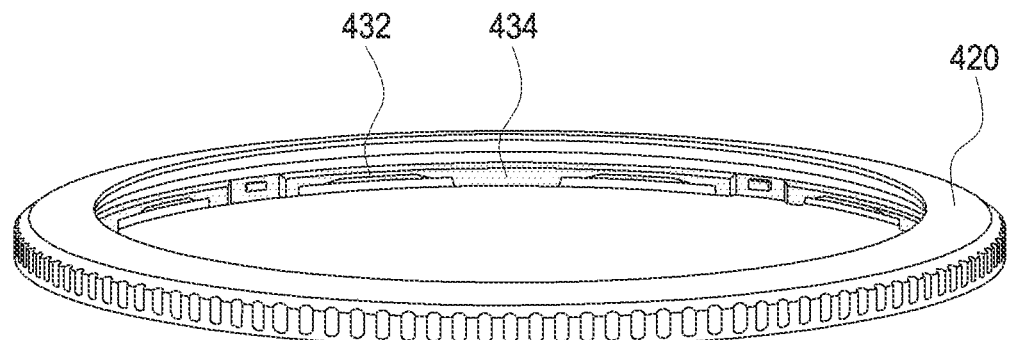
FIG. 19 is a perspective view illustrating an electronic device according to various embodiments of the disclosure, wherein a ring structure is fastened to a wheel structure.

FIG. 18 is a diagram schematically illustrating an electronic device (for example, 400) according to various embodiments of the disclosure, wherein a ring structure 430 is fastened to a wheel structure 420. FIG. 19 is a perspective view illustrating the electronic device (for example, 400) according to various embodiments of the disclosure, wherein a ring structure (for example, 430) is fastened to a wheel structure 420.

Referring to FIG. 18 and FIG. 19, the electronic device 400 according to various embodiments of the disclosure may first fasten the ring structure 430 to the wheel structure 420. The ring structure according to various embodiments of the disclosure may have a second portion 433 protruding from the body 431 together with a third portion 434 in different directions (for example, the second portion 433 and the third portion 434 may be perpendicular to each other). If the second portion 433 is inserted into a second extension slot 423 in such a type of ring structure 430, the third portion 434 may abut the second inner surface (for example, 422) of the wheel structure 420. According to an embodiment, the wheel structure 420 and the ring structure 430, which are coupled to each other, may then be coupled to an annular protrusion (for example, 412).

Figure 20:
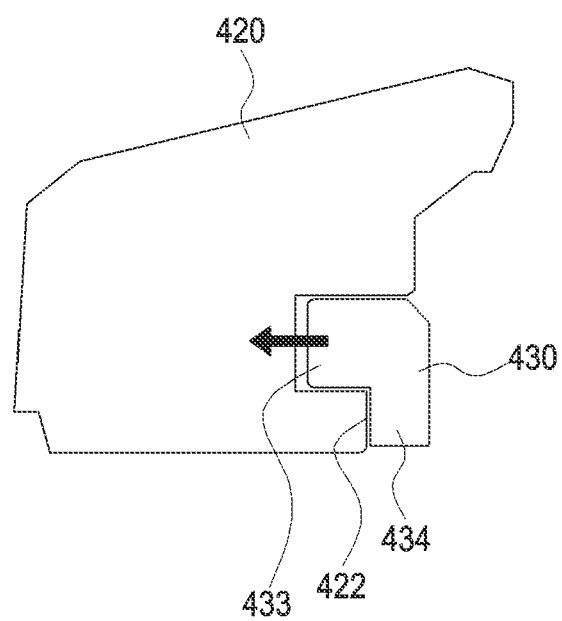
FIG. 20 is a sectional view illustrating an electronic device according to various embodiments of the disclosure, wherein a ring structure is fastened to a wheel structure.

FIG. 20 is a sectional view illustrating a method for fastening a ring structure 430 to a wheel structure 420 in connection with an electronic device (for example, 400) according to various embodiments of the disclosure.

Figure 21:
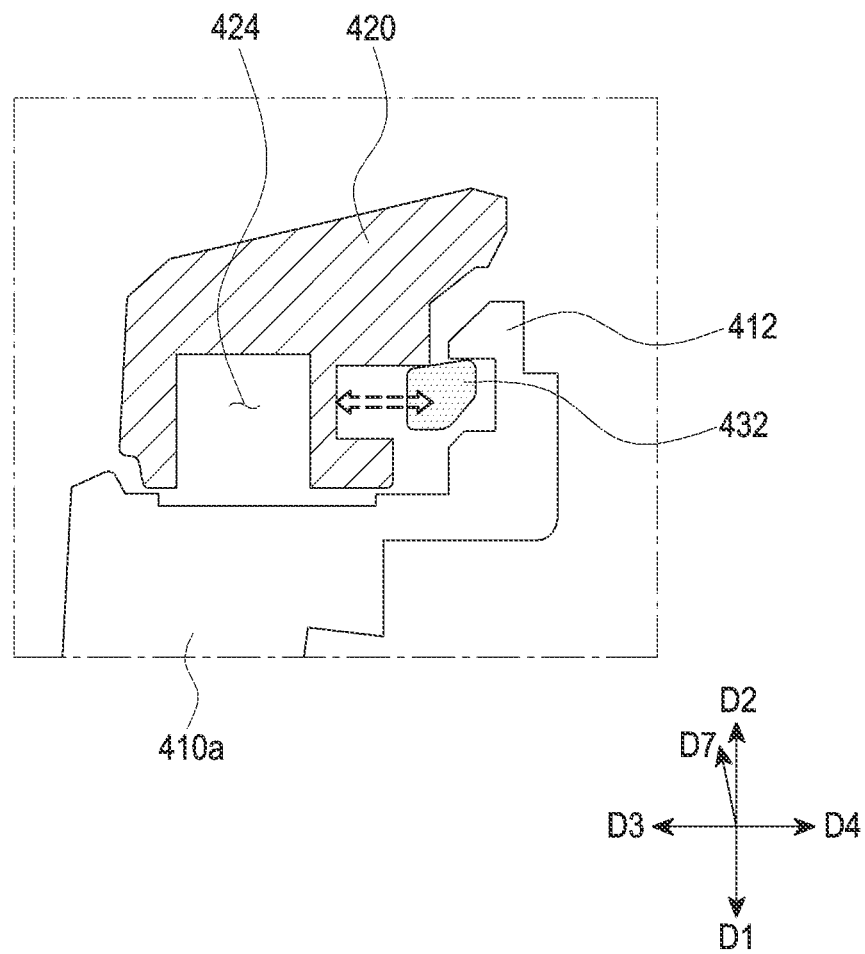
FIG. 21 is a sectional view illustrating the relation of disposition among a wheel structure, a ring structure, and a housing when the ring structure is fastened to the wheel structure in connection with an electronic device according to various embodiments of the disclosure.

FIG. 21 is a sectional view illustrating the relation of disposition among a wheel structure 420, a ring structure (for example, 430), and a housing (for example, 410) when the ring structure (for example, 430) is fastened to the wheel structure 420 in connection with an electronic device (for example, 400) according to various embodiments of the disclosure.

Figure 22:
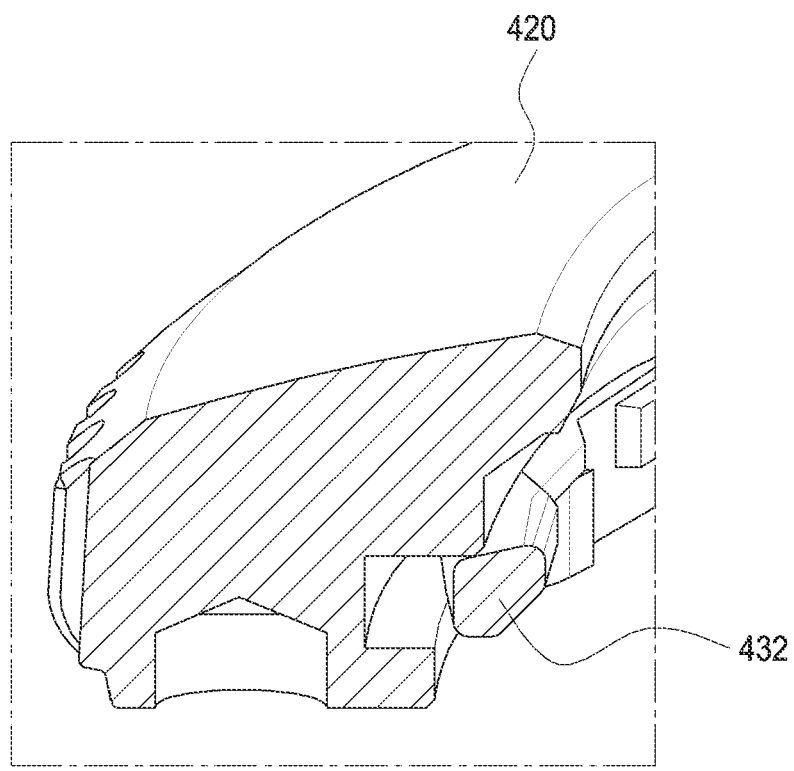
FIG. 22 is a magnified perspective view illustrating a first portion when a ring structure is fastened to a wheel structure in connection with an electronic device according to various embodiments of the disclosure.

FIG. 22 is a magnified perspective view illustrating a first portion 432 when a ring structure (for example, 430) is fastened to a wheel structure 420 in connection with an electronic device (for example, 400) according to various embodiments of the disclosure.

Figure 23:
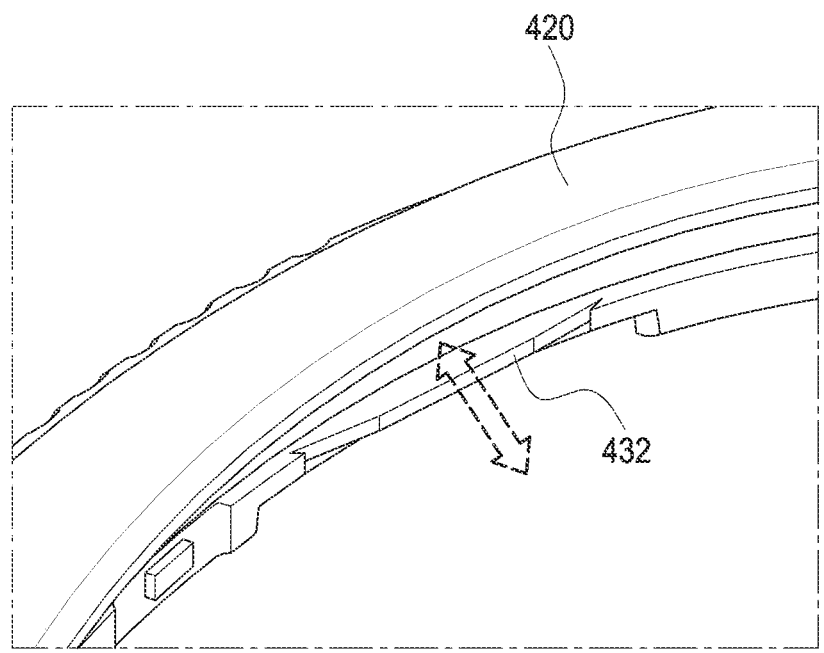
FIG. 23 is a diagram illustrating a direction in which a first portion can move when a ring structure is fastened to a wheel structure in connection with an electronic device according to various embodiments of the disclosure.

FIG. 23 is a diagram illustrating a direction in which the first portion 432 can move when the ring structure (for example, 430) is fastened to the wheel structure 420 in connection with the electronic device 400 according to various embodiments of the disclosure.

According to various embodiments of the disclosure, a wheel structure 420 and a ring structure (for example, 430) may be connected to each other and may then connected to an annular protrusion (for example, 412). The connection according to various embodiments of the disclosure may include coupling, fastening, assembly, or other possible physical connections.

If multiple corrugations (for example, 436) are formed on the second portion 433 and then inserted into a second extension slot 423 according to various embodiments, the wheel structure 420 and the ring structure (for example, 430) may be fastened to each other and then remain tightly fitted to each other.

According to an embodiment, the second portion 433 may be inserted into the second extension slot 423 to such an extent that the second inner surface 422 and the third portion 434 are fully forced against each other.

Referring back to FIG. 18, the ring structure 430 may have a bumpy overall shape by means of the body 431 and the plurality of portions (for example, first portion 432 and second portion 433) protruding from the body 431. Therefore, when viewed from above the wheel structure 420, which is coupled to the ring structure 430, the body 431 and the second portion 433 may be considerably covered by the wheel structure 420, but at least a part of the first portion 432 may partially protrude toward the center of the ring structure 430.

The electronic device (for example, 400) according to various embodiments may have a space formed between the wheel structure 420 and the housing 410 on the section of the part on which the first portion 432 is formed, as illustrated in FIG. 22, along the circumferential direction of the body 431. Accordingly, when the second portion 433 is tightly fitted into the second extension slot 423, the first portion 432 may elastically move in the second extension slot 423.

According to various embodiments, the ring structure (for example, 430) may be bent and restored. Therefore, the assembly of the wheel structure 420 and the ring structure (for example, 430) may be coupled to the annular protrusion (for example, 412) by coupling the wheel structure 420 and the ring structure 430 and then pressing the first portion 432 toward the second extension slot (for example, 423) of the wheel structure 420. Referring to FIG. 22 and FIG. 23 together, when the assembly of the wheel structure 420 and the ring structure (for example, 430) is coupled to the housing (for example, 410), the first portion 432 may elastically deform and move into the second extension slot (for example, 423), and if the coupling to the housing (for example, 410) is completed, the first portion 432 may return to the original state.

Referring to FIG. 20 to FIG. 23 together, a housing (for example, 410) may be prepared separately from the wheel structure 420 to which the ring structure (for example, 430) is fastened. A display (for example, 220) may be exposed to a surface of the prepared housing (for example, 410).

According to various embodiments, if the wheel structure 420 to which the ring structure (for example, 430) is assembled to the annular protrusion (for example, 412) of the housing (for example, 410), the wheel structure 420 may be rotatably provided on the periphery of the housing (for example, 410).

For example, assuming that the electronic device (for example, 400) has the above-described structure in FIG. 1 to FIG. 23 when assembled through the above assembly process, if the ring structure (for example, 430) is fastened to the wheel structure 420, the second portion 433 protruding from the body 431 in the third direction (for example, D3 in FIG. 21 or direction parallel to D3) may be led and seated in the second extension slot 423. The third portion 434 protruding in the first direction (for example, D1 in FIG. 21 or direction parallel to D1) in the same position as the second portion 433 or in a close position may be positioned to face each of the second inner surface 422 of the housing 410 and the second surface 413.

According to various embodiments, when the ring structure (for example, 430) assembled to the wheel structure 420 is seated on the housing (for example, 410), at least a part of the first portion 432 and at least a part of the body 431 on which the first portion 432 is formed may be elastically pushed toward the second extension slot 423 and may be temporarily led into the second extension slot 423. Next, if at least a part of the first portion 432 and at least a part of the body 431 on which the first portion 432 is formed, which have been temporarily led in, are positioned to correspond to the first extension slot 414, the same may be moved toward the first extension slot 414 by a restoring force, and the first portion 432 may be led into the first extension slot 414.

According to various embodiments, the first portion 432 of the ring structure (for example, 430) may be fastened to the first extension slot 414, the second portion 433 thereof may be fastened to the second extension slot 424, and the wheel structure 420 may accordingly be rotatably seated on the annular protrusion (for example, 412) of the housing (for example, 410). This may prevent separation, as well as limit movements, occurring in the first direction (D1 in FIG. 21 or direction parallel to D1) and/or second direction (for example, D2 in FIG. 21 or direction parallel to D2) against the user's intent. In addition, since the third portion 434 is seated between the second surface 413 of the housing (for example, 410) and the second inner surface 422 of the wheel structure 420, movements in the third direction (for example, D3 in FIG. 21 or direction parallel to D3) or in the opposite direction (for example, D4 in FIG. 21 or direction parallel to D4) to the third direction may be prevented.

Hereinafter, an embodiment may be described with reference to FIG. 24 to FIG. 26C, the embodiment for the purpose of effectively limiting movements of a wheel structure (for example, 420) on a virtual horizontal plane defined by direction components D3 and D5 and preventing jamming during operation, in connection with an electronic device (for example, 400) according to various embodiments of the disclosure.

Figure 24:
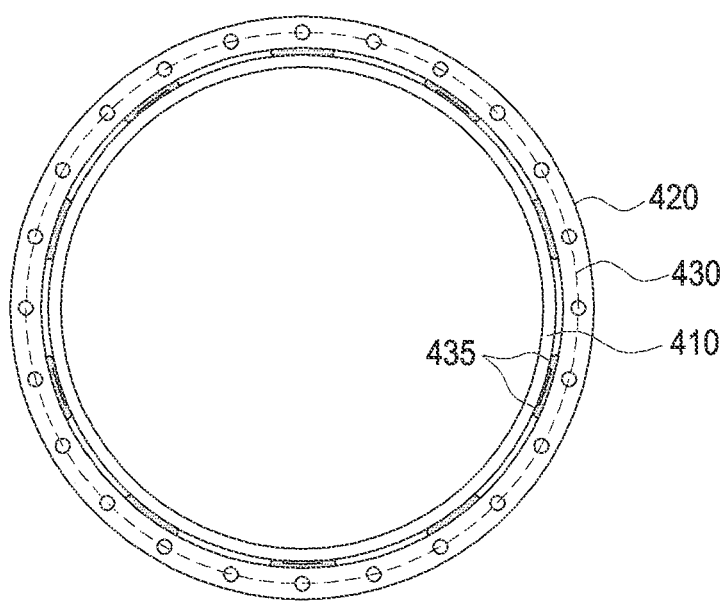
FIG. 24 is a top view of protrusions formed on a ring structure, when the ring structure is disposed between a wheel structure and a housing, in connection with an electronic device according to various embodiments of the disclosure.

FIG. 24 is a top view of protrusions 435 formed on a ring structure 430, when the ring structure 430 is disposed between a wheel structure 420 and a housing 410, in connection with an electronic device (for example, 400) according to various embodiments of the disclosure.

Figure 25:
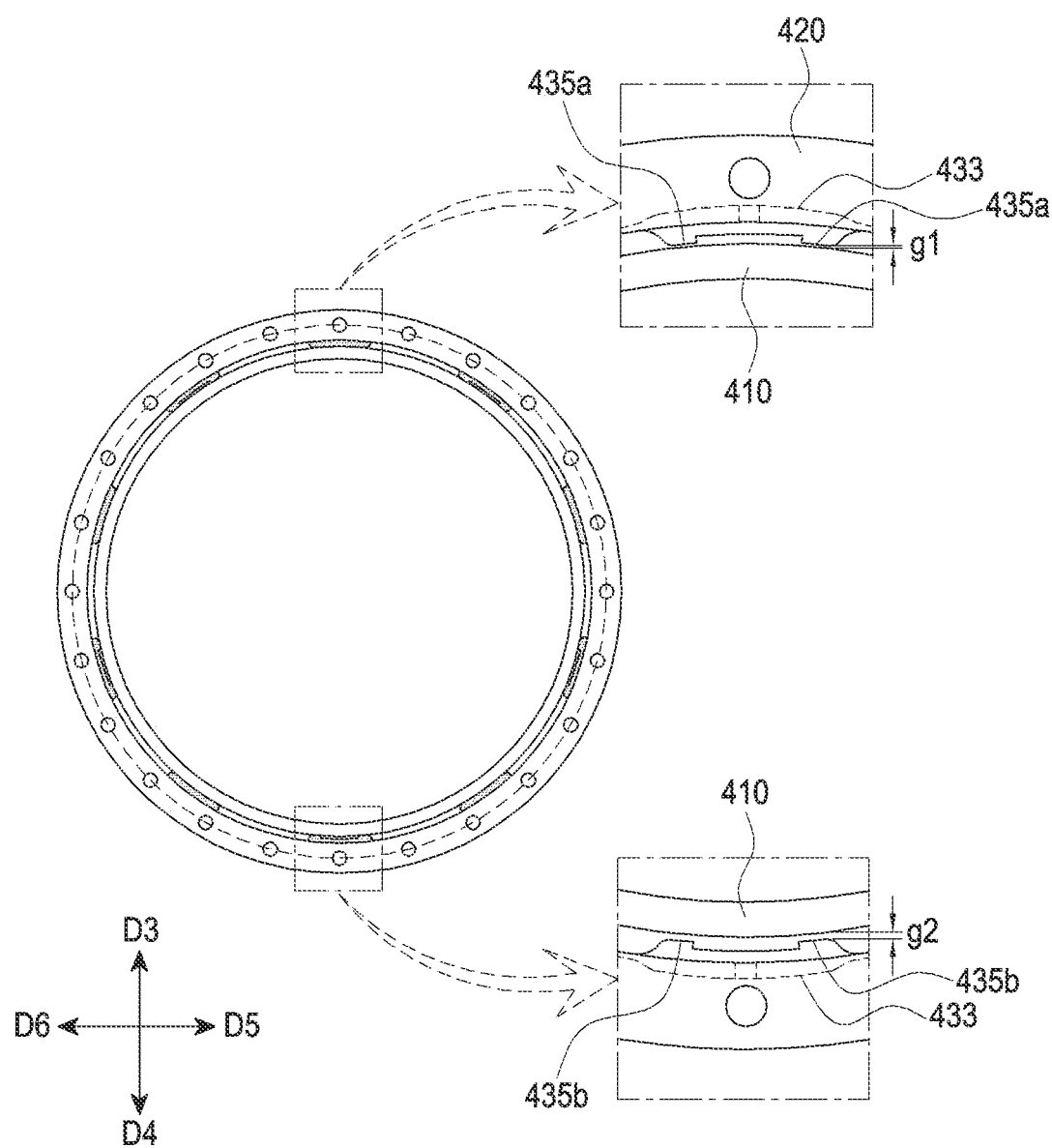
FIG. 25 is a magnified view of protrusions formed on a ring structure in connection with an electronic device according to various embodiments of the disclosure.

FIG. 25 is a magnified view of the protrusions 435 formed on the ring structure 430, when the ring structure 430 is disposed between the wheel structure 420 and the housing 410, in connection with the electronic device (for example, 400) according to various embodiments of the disclosure.

Figure 26A:
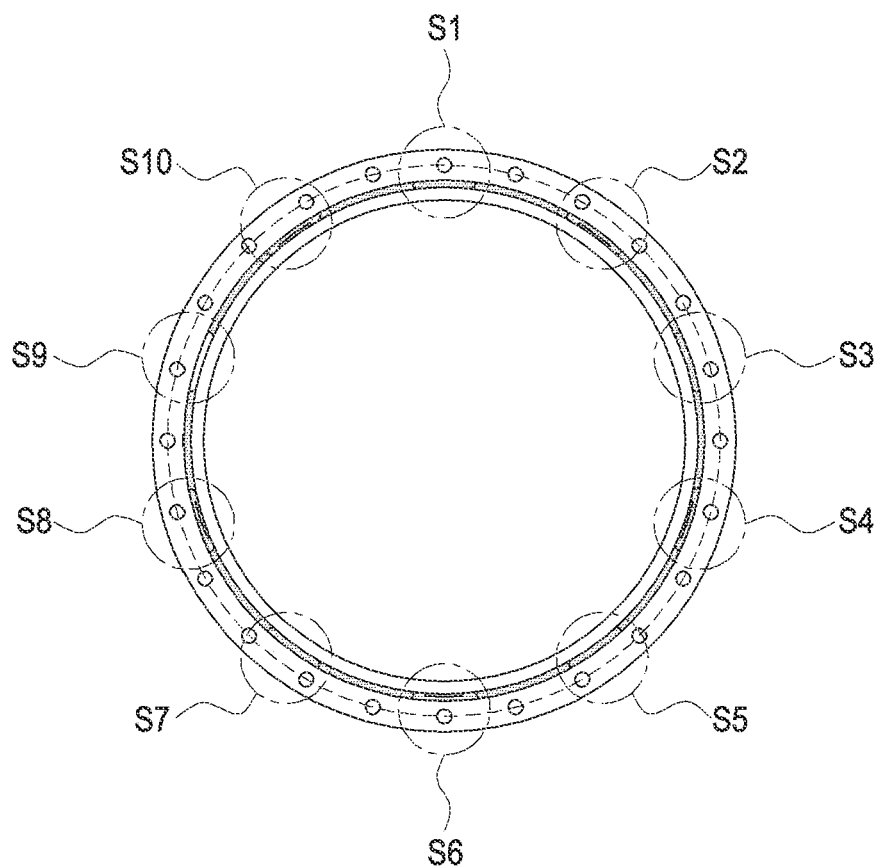
FIG. 26A to FIG. 26C are diagrams illustrating the relation of disposition of a plurality of protrusions having different heights in connection with an electronic device according to various embodiments of the disclosure.
Figure 26B:
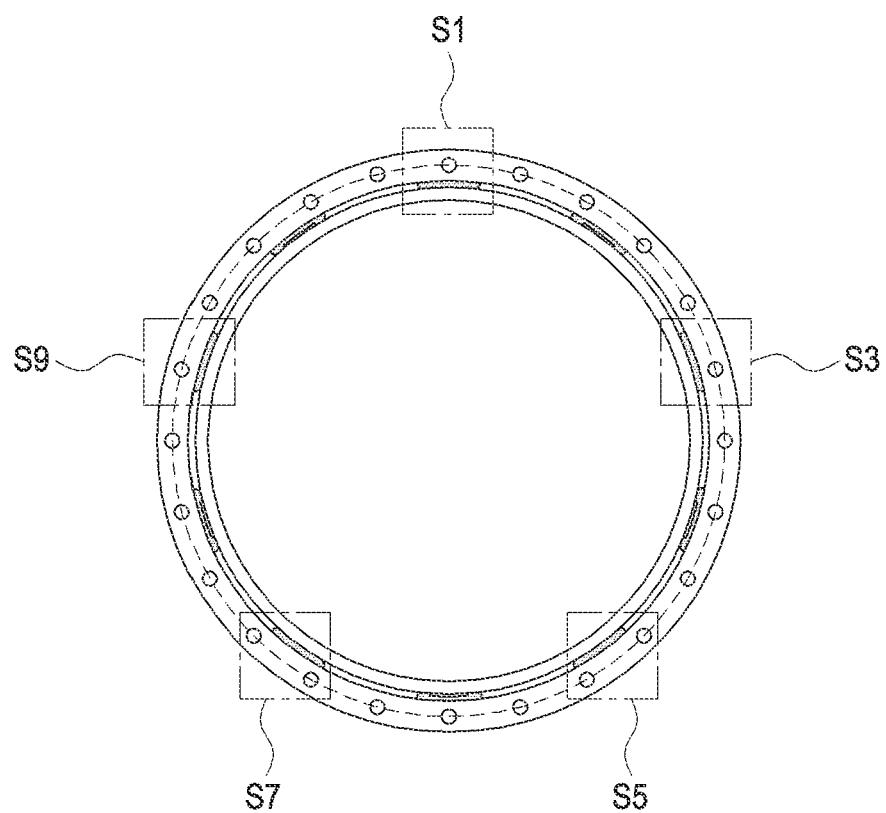
Figure 26C:
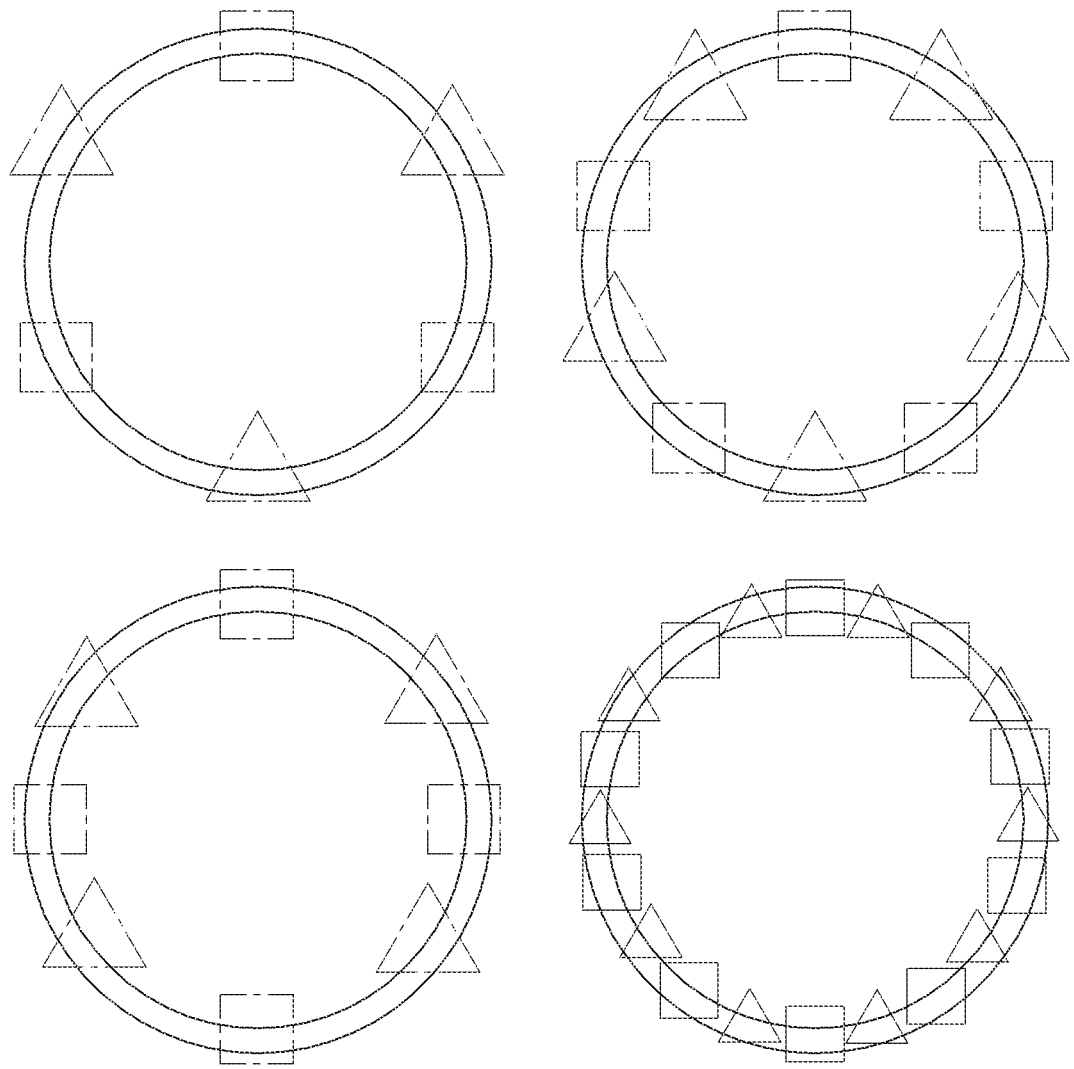

FIG. 26A to FIG. 26C are diagrams illustrating the relation of disposition of a plurality of protrusions 435 having different heights, when a ring structure 430 is disposed between a wheel structure 420 and a housing 410, in connection with an electronic device (for example, 400) according to various embodiments of the disclosure.

The electronic device (for example, 400) according to various embodiments of the disclosure may include at least one protrusion 435 formed on at least a part of the surface of the third portion 434 toward the second surface (for example, 413) of the housing 410. According to an embodiment, the third portion 434 may be positioned in the same section (for example, P1) as the second portion 433. In this case, the protrusion 435 may protrude in the opposite direction to the direction in which the second portion 433 protrudes, as illustrated in FIG. 25.

According to various embodiments, the gap between the wheel structure 420 and the housing 410 may be adjusted by forming a protrusion 435 for limiting the horizontal movement of the wheel structure 420. According to various embodiments, the gap between the wheel structure 420 and the housing 410 may be obtained by subtracting the width of the third portion 434 (for example, width in direction D3 or D4 in FIG. 13) from the gap 419 between the second surface (for example, 413) and the second inner surface 422.

The electronic device 400 according to various embodiments of the disclosure may have protrusions 435 formed on the third portion 434 of the ring structure (for example, 430) such that the ring structure 430 is spaced apart from the second surface (for example, 413) and has different distances of spacing in directions symmetric with reference to the center of the ring structure, thereby preventing jamming from occurring during operation of the wheel structure 420 according to the processing tolerance.

According to various embodiments, at least two protrusions (for example, 435) may be formed such that a first protrusion 435a positioned on at least a part of the ring structure and a second protrusion 435b positioned on the opposite side with reference to the center of the ring structure have different heights. In an embodiment, the second protrusion 435b may be positioned on a virtual straight line connecting the first protrusion 435a and the center of the ring structure (for example, 430).

Referring to FIG. 25, assuming, for example, that the gap resulting from the first protrusion 435a is g1, and the gap resulting from the second protrusion 435b is g2, g1 may be configured as 0-0.01 mm, and g2 may be configured as 0.05-0.06 mm. That is, a protrusion may be formed on a side of the ring structure 430 so as to have a large height, and another protrusion may be formed on another side symmetric thereto so as to have a small height. Accordingly, the gap between the third portion 434 and the housing 410 may be formed to be partially different along the circumference of the ring structure 430. In this case, even if the gap g1 resulting from the first protrusion 435a is small, a sufficient gap g2 may be secured by the opposite second protrusion 435b, thereby preventing jamming near the first protrusion 435a.

Referring to FIG. 26A to FIG. 26C, the electronic device 400 according to various embodiments of the disclosure may have the first protrusion (for example, 435a) and the second protrusion (for example, 435b) disposed alternately along the longitudinal direction of the circumference of the ring structure 430.

According to various embodiments, a plurality of protrusions may be provided, and at least one of the plurality of protrusions may be paired with another protrusion formed to have a different spacing distance in a direction symmetric with regard to the center of the ring structure. According to various embodiments, a plurality of such pair structures may be provided and formed repeatedly/alternately along the circumferential direction of the ring structure 430.

This may prevent jamming in the entire direction in which the ring structure 430 faces the housing 410.

Assuming, for example, that ten third portions (for example, 434) are disposed along the circumferential direction of the ring structure 430, protrusions may be disposed on the ten third portions (for example, 434), respectively, such that adjacent parts have protrusions forming different gaps. According to an embodiment, among a plurality of subsections S1 to S10 illustrated in FIG. 26A, first protrusions 435a having a gap g1 may be disposed in subsections S1, S3, S5, S7, and S9, and second protrusions 435b having a gap g2 may be disposed in subsections S2, S4, S6, S8, and S10. For example, the subsection S1 may be paired with the subsection S6 positioned on the opposite side, and the subsection S2 may be paired with the subsection S7 positioned on the opposite side.

The number of protrusions 435 according to various embodiments of the disclosure is not limited to any specific embodiment. In addition, the protrusion 435 is not necessarily disposed on each third portion 434. In addition, according to various embodiments, the protrusion 435 may be disposed in a position on the ring structure 430 in which no third portion 434 is formed.

For example, as illustrated in FIG. 26C, first protrusions (for example, 435a) and second protrusions (for example, 435b) may be disposed in variously configured modes. In this case, quadrangular dotted lines may denote sections in which first protrusions (for example, 435a) are disposed, and triangular dotted lines may denote sections in which second protrusions (for example, 435b) are disposed.

Two upper diagrams illustrated in FIG. 26C may illustrate an exemplary embodiment in which odd-numbered first protrusions (for example, 435a) and odd-numbered second protrusions (for example, 435b) are disposed, and two lower diagrams illustrated in FIG. 26C may illustrate an exemplary embodiment in which even-numbered first protrusions (for example, 435a) and even-numbered second protrusions (for example, 435b) are disposed. Disposition of odd-numbered first protrusions (for example, 435a) and odd-numbered second protrusions (for example, 435b) as in the two upper diagrams in FIG. 26C may be advantageous in terms of limiting movements on a virtual horizontal plane when the wheel structure (for example, 420) is seated on the housing (for example, 410), compared with disposition of even-numbered first protrusions (for example, 435a) and even-numbered second protrusions (for example, 435b) as in the two lower diagrams in FIG. 26C.

The shape of the protrusions (for example, 435) according to various embodiments of the disclosure is not limited to any specific shape. For example, although approximately circular protrusions (for example, 435) are illustrated in the drawings, protrusions may also have rectangular sectional shapes.

Next, embodiments for limiting the vertical movement of a wheel structure (for example, 420) and preventing fluctuation, in connection with an electronic device (for example, 400) according to various embodiments of the disclosure, may be described with reference to FIG. 27 to FIG. 31.

Figure 27:
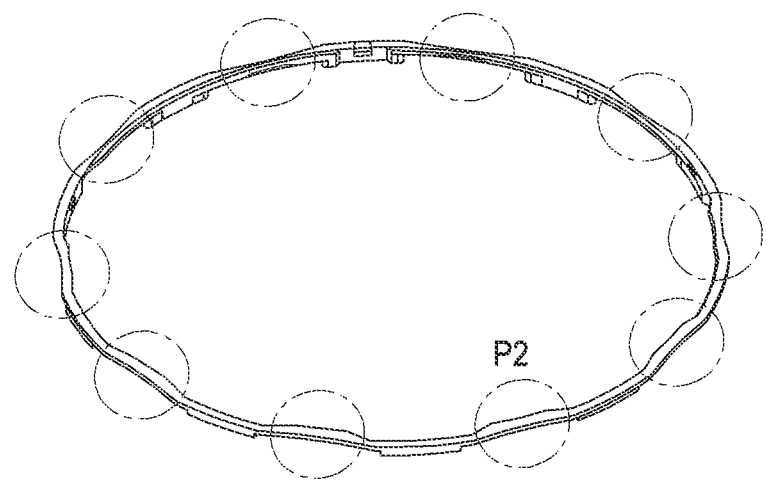
FIG. 27 is a perspective view illustrating a section of an electronic device according to various embodiments of the disclosure, in which a first portion of a ring structure is formed.
Figure 28:
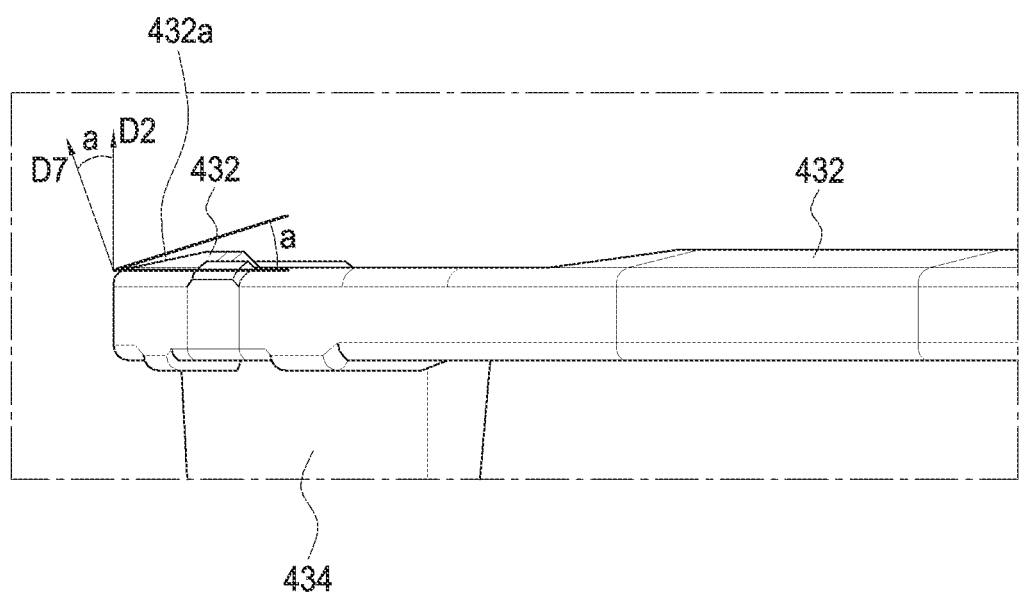
FIG. 28 is a side view of the hook shape of a ring structure of an electronic device according to various embodiments of the disclosure.

FIG. 27 is a perspective view illustrating a section of an electronic device (for example, 400) according to various embodiments of the disclosure, in which a first portion 432 of a ring structure (for example, 430) is formed. FIG. 28 is a side view of the shape of a hook of a ring structure (for example, 430) of an electronic device (for example, 400) according to various embodiments of the disclosure.

Referring to FIG. 27 and FIG. 28 together, in connection with the ring structure (for example, 430) according to various embodiments of the disclosure, at least one of the plurality of portions may have an upper surface facing in a fourth direction D7 that forms an angle of 5-45° with the second direction D2. In connection with the electronic device (for example, 400) according to various embodiments of the disclosure, one of the plurality of portions may be the first portion 432. According to an embodiment, portions may be disposed at a predetermined interval along the circumferential direction of the ring structure (for example, 430), as illustrated in FIG. 27.

According to various embodiments of the disclosure, a plurality of first portions 432 may be provided in a section P2 divided along the circumference of the body 431. According to various embodiments, the first portions 432 may protrude from the body (for example, 431) toward the center of the ring structure (for example, 430) overall or schematically, but may protrude so as to form upper surfaces 432 facing in the fourth direction.

First portions 432 according to various embodiments of the disclosure may include upper surfaces 432a facing in the fourth direction that forms a predetermined angle with the second direction (for example, D2). According to an embodiment, as illustrated in FIG. 28, the direction of the normal line perpendicular to the upper surface 432a may be the fourth direction. According to another embodiment, a direction parallel to the upper surface 432a may be the fourth direction. Referring to FIG. 28, the angle between the second direction (for example, D2) and the fourth direction (for example, D7) may be variously configured in the range of 5-45°. For example, according to an embodiment of the disclosure, the angle of the fourth direction (for example, D7) may form an angle of 10-30° with the second direction (for example, D2). According to another embodiment, the angle of the fourth direction (for example, D7) may form an angle of 15-25° with the second direction (for example, D2). According to an embodiment, the angle of the fourth direction (for example, D7) may include a unit below the decimal point. For example, the angle of the fourth direction (for example, D7) illustrated in FIG. 28 may be about 15° (for example, 14.85°).

According to another embodiment of the disclosure, the angle of the fourth direction (for example, D7) may form an angle of 17-20° with the second direction. According to another embodiment, the angle of the fourth direction (for example, D7) may form an angle of 18-19° with the second direction (for example, D2).

According to various embodiments of the disclosure, the angle of the fourth direction may be variously formed according to the interval (for example, l2) between the first top surface (for example, 414a) of the first extension slot (for example, 414) and the first bottom surface (for example, 414c) thereof, or the interval (for example, l3) between the second top surface (for example, 423a) of the second extension slot (for example, 423) and the second bottom surface (for example, 423c) thereof. In an embodiment, the angle of the fourth direction may be variously formed according to the material of the ring structure (for example, 430).

The description that the first portion 432 has the angle of the fourth direction in connection with the electronic device 400 according to various embodiments of the disclosure may mean that, when the first portion 432 is fastened to the first extension slot (for example, 414), the same is fastened to the first extension slot (for example, 414) so as to slope upwards from the body 431.

According to various embodiments, when the first portion 432 is fastened to the first extension slot (for example, 414) so as to slope upwards, the second portion 433 may be fastened so as to be fitted into the second extension slot (for example, 423). In this case, the ring structure (for example, 430) may be supported by the housing (for example, 410), thereby applying a force that presses the wheel structure (for example, 420) against the first surface (for example, 411) of the housing (for example, 410).

Figure 29:
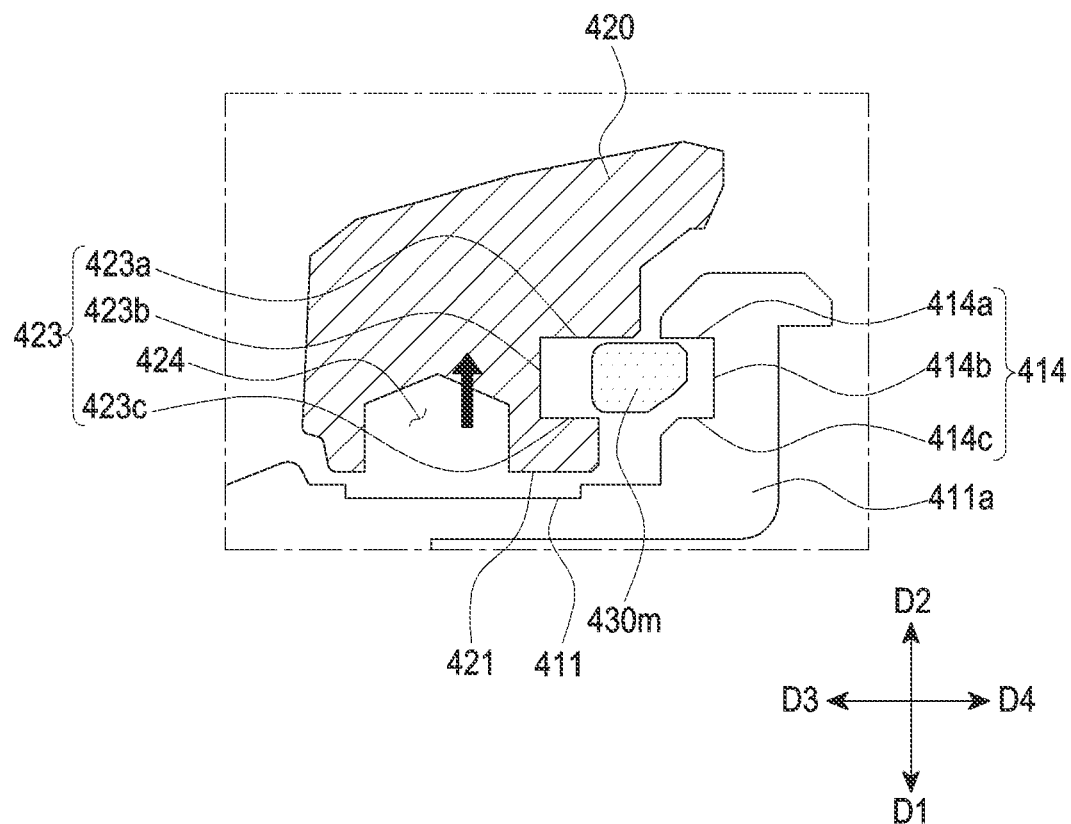
FIG. 29 is a diagram illustrating an exemplary ring structure having no hook shape.
Figure 30:
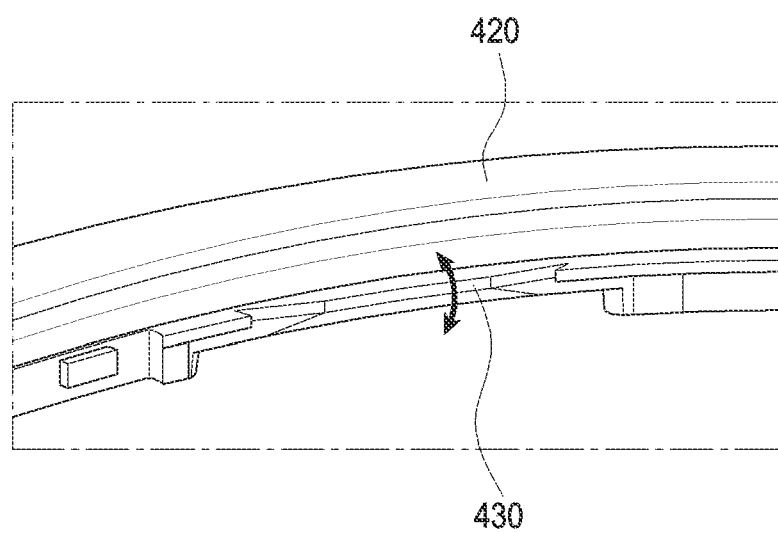
FIG. 30 is a diagram illustrating an electronic device according to various embodiments of the disclosure, wherein a twist tension acts on a ring structure.
Figure 31:
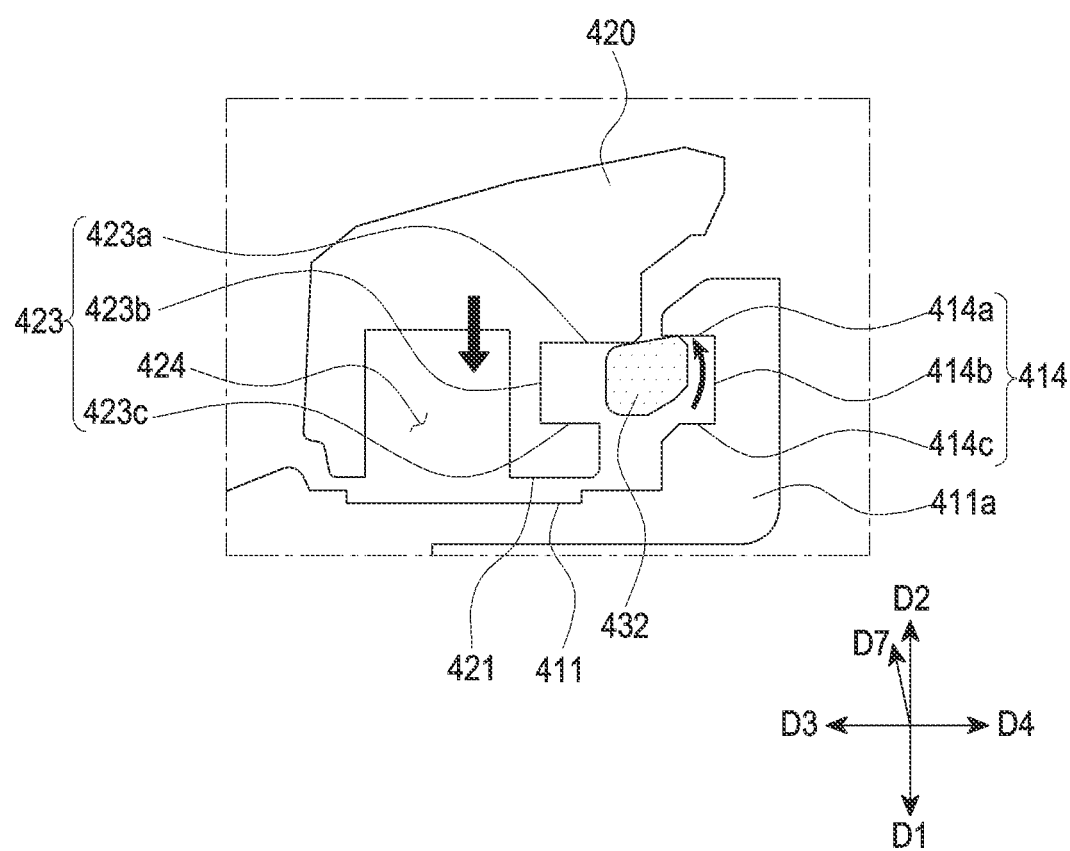
FIG. 31 is a diagram illustrating an electronic device according to various embodiments of the disclosure, wherein a wheel structure is forced against a housing by a twist tension acting on a ring structure.

FIG. 29 is a diagram illustrating an exemplary ring structure 430m having no hook shape. FIG. 30 is a diagram illustrating an electronic device (for example, 400) according to various embodiments of the disclosure, wherein a twist tension acts on a ring structure 430. FIG. 31 is a diagram illustrating an electronic device (for example, 400) according to various embodiments of the disclosure, wherein a wheel structure 420 is forced against a housing (for example, 410) by a twist tension acting on a ring structure (for example, 430).

Referring to FIG. 29 together with FIG. 8 and FIG. 21 again, the housing (for example, 410) of the electronic device 400 may have a first detent groove 416. According to an embodiment, the side member 410a may include a member configured to apply an elastic force, such as a detent spring 418, and a detent ball 417 supported thereby.

According to various embodiments, a second detent groove 424 may be formed on the lower surface of the wheel structure 420 such that the detent ball 417 is contained therein.

According to an embodiment, a plurality of first detent grooves 416 and a plurality of second detent grooves 424 may be formed on the first surface 411 and on the lower surface of the wheel structure 420, respectively, and may extend so as to have curves along the direction of rotation of the wheel structure 420 on respective surfaces.

According to an embodiment, the detent ball 417 may be at least partially contained in the first detent groove 416 or the second detent groove 424 and may move in the first direction (for example, D1 or direction parallel to D1) or second direction (for example, D2 or direction parallel to D2) while the wheel structure 420 rotates.

For example, if the detent ball 417 is contained in the first detent groove 416, and if the wheel structure 420 rotates, the detent ball 417 may contact a part of the lower surface of the wheel structure 420, which has no groove formed thereon, and may then be inserted into the second detent groove 424 provided on the lower surface of the wheel structure 420. According to an embodiment, the detent ball 417 may be moved in the second direction by the detent spring 418 and inserted into the second detent groove 424, and the user may then have a feeling of detent resulting from the rotation of the wheel structure 420.

Although it is assumed herein that a ball, a spring, or the like is formed to enable the user to have a feeling of detent during the rotation of the wheel structure 420, this is only an example and is not limiting in any manner.

The wheel structure 420 according to various embodiments may undergo fluctuation as a result of a mechanism of interaction among the detent ball 417, the detent spring 418, and the second detent groove 424 during an operation.

For example, if the detent spring 418 loses the restoring force, an abnormal movement may occur due to the fluctuation. The interval between the wheel structure 420 and the housing 410 may be increased by the elastic force from the spring 418 while the wheel structure 420 rotates. According to an embodiment, the gap between the first inner surface 421 and the first surface 411 may deviate from an allowable range.

For example, in the case of a ring structure 430m having no hook shape as in FIG. 29, the detent spring 418 may exert a force that pushes the detent ball (for example, 417) upwards (for example, D2), and fluctuation may occur during a rotating (dialing) operation of the wheel structure 420 if the detent spring 418 loses the restoring force.

The electronic device (for example, 400) according to various embodiments of the disclosure may have a first portion 432 as illustrated in FIG. 31. Since first portion 432 is fastened to the first extension slot 414 of the housing 410 while sloping upwards, bending may occur, and a twisting tension resulting therefrom may force the first inner surface 421 against the first surface 411. Therefore, the wheel structure 420 may be forced against the housing 410.

According to various embodiments, the first portion 432 may then be supported downwards (for example, in direction D1) by the first extension slot 414. According to an embodiment, the first portion 432 may be supported downwards (for example, in direction D1) by the first top surface 414a. Since the second portion 433 is inserted into the second extension slot 423 in this state, the ring structure 430 is, seen as a whole, supported by the housing 410, and may press the wheel structure 420 in the first direction (for example, direction D1).

According to various embodiments of the disclosure, the third portion 434 of the ring structure 430 may be inserted into a gap (for example, 419), in addition to the above-described embodiment. In this case, the second portion 433 of the ring structure 430 is supported by the second extension slot 423, the third portion 434 thereof is inserted into and supported by the gap 419, and the first portion 432 thereof is supported downwards. Accordingly, the ring structure 430 may receive a larger twisting tension while being firmly supported between the wheel structure 420 and the housing 410. Therefore, the wheel structure 420 is forced against the housing 410, and the gap between the wheel structure 420 and the housing 410 may be stably maintained even while the wheel structure 420 rotates.

The electronic device according to various embodiments may be one of various types of electronic devices. The electronic devices may include, for example, a computer device, a portable communication device (e.g., a smart phone), a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular expression may include a plural expression, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. Such terms as "1st" and "2nd," or "first" and "second" may represent corresponding components regardless of order or importance, may be used to simply distinguish one component from another, and do not limit the corresponding components. When it is described that an element (e.g., a first element) is "(operatively or communicatively coupled with/to" or "connected" to another element (e.g., a second element), the element can be directly connected to the other element or can be connected to the other element through another element (e.g., a third element).

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, the module may be implemented as an application-specific integrated circuit (ASIC).

Various embodiments as set forth herein may be implemented as software (e.g., the program 140) including an instruction that is stored in a machine-readable storage medium (e.g., internal memory 136 or external memory 138) that is readable by a machine (e.g., a computer). The machine is a device capable of invoking the stored instruction and operating according to the invoked instruction, and may include the electronic device (e.g., the electronic device 101, 200, or 300) according to the embodiments set forth herein. When the instruction is executed by the processor (e.g., the processor 120), the processor may perform functions corresponding to the instruction directly, or functions corresponding to the instruction can be performed using other components under the control of the processor. The instruction may include a code generated by a complier or a code executable by an interpreter. The machine-readable storage medium may be provided in the form of a non-transitory storage medium. Wherein, the term "non-transitory" simply means that the storage medium is a tangible device, and does not include a signal, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed online via an application store (e.g., Play Store™). If distributed online, at least part of the computer program product may be temporarily generated or at least temporarily stored in the machine-readable storage medium, such as memory of the manufacturer's server, a server of the application store, or a relay server.

Each component (e.g., a module or a program) according to various embodiments may include a single entity or multiple entities. Some of the above-described sub-components may be omitted, or one or more other components may be added to various embodiments. Alternatively or additionally, some components (e.g., modules or programs) may be integrated into a single entity, and the single entity may still perform one or more functions of each of some components in the same or similar manner as they are performed by a corresponding one of some components before the integration. According to various embodiments, operations performed by the module, the program, or another component may be carried out sequentially, in parallel, repeatedly, or heuristically, or one or more of the operations may be executed in a different order or omitted, or one or more other operations may be added. Hereinafter, according to various embodiments, an electronic device will be described with reference to the accompanying drawings. The term "user" herein may refer to a person who uses an electronic device, or a device (e.g., an artificial intelligence electronic device) which uses an electronic device.

According to various embodiments of the disclosure, an electronic device may include: a housing including a rear plate facing in a first direction and a side member coupled to the rear plate, wherein the rear plate and the side member form a recess having a circular periphery; a circular display positioned at least partially in the recess; a wheel structure ratable around the display; and a ring structure formed of a polymeric material. When viewed from above the recess, the side member may include: a first surface facing in a second direction opposite to the first direction, the first surface including an inner edge and an outer edge; and an annular protrusion protruding from the inner edge, while defining the circular periphery. The annular protrusion may include: a second surface facing away from the recess in a third direction substantially perpendicular to the second direction; and a first extension slot formed on the second surface near the recess. The wheel structure may include: a first inner surface facing the first surface; a second inner surface facing the second surface; and a second extension slot formed on the second inner surface near the recess. The ring structure may include a plurality of portions, each of the plurality of portions being partially inserted into the first extension slot and partially inserted into the second extension slot. At least one of the plurality of portions may include an upper surface facing in a fourth direction forming an angle of 5-45° with the second direction.

According to various embodiments, the angle may be 10-30°.

According to various embodiments, the angle may be 15-25°.

According to various embodiments, the angle may be 17-20°.

According to various embodiments, the angle may be 18-19°.

According to various embodiments, the polymeric material may include at least one of polyoxymethylene, polyacetal, and acetal resin.

According to various embodiments, the ring structure may be configured to bias the wheel structure towards the first surface.

According to various embodiments, the plurality of portions may include a first portion inserted into the first extension slot and a second portion inserted into the second extension slot.

According to various embodiments, a plurality of first portions and a plurality of second portions may be provided and are disposed alternately along a circumferential direction of the ring structure.

According to various embodiments, the second portion may be fitted into the second extension slot.

According to various embodiments, the plurality of portions may include a third portion contained in a space between the second surface and the second inner surface.

According to various embodiments, the third portion may be formed to be substantially perpendicular to the second portion.

According to various embodiments, the third portion may include a protrusion formed towards the second surface.

According to various embodiments, a plurality of protrusions may be provided, the plurality of protrusions may include a first protrusion and a second protrusion positioned on a virtual straight line joining the first protrusion and a center of the ring structure, and the distance between the second protrusion and the housing may be larger than the distance between the first protrusion and the housing.

According to various embodiments, the ring structure may be partially cut and interposed between the wheel structure and the annular protrusion while an end of the ring structure and another end thereof substantially face each other.

According to various embodiments of the disclosure, there may be provided a structure for limiting movements of a rotatable member, the structure including: a housing; an edge portion disposed on a surface of the housing; a wheel structure installed on a surface of the housing to be able to rotate along the edge portion while being spaced apart from the edge portion by a predetermined interval; and a ring structure disposed in a space formed between the wheel structure and the edge portion so as to fasten the wheel structure and the edge portion. At least a part of the ring structure may be supported by the wheel structure such that the horizontal movement thereof is limited. The ring structure may have a hook formed on at least a part thereof and may be supported by the edge portion such that the wheel structure is pressed against the housing by means of bending of the ring structure.

According to various embodiments, the hook may be inserted into the first extension slot formed on the edge portion so as to be supported downwards from the ceiling inside the first extension slot and so as to force the wheel structure against the housing by means of the twisting tension formed in the hook.

According to various embodiments, the ring structure may be divided into a first section in which a hook is formed and a second section in which no hook is formed, along the circumferential direction of the ring structure. A protruding structure may be formed in the second section so as to face in a direction different from the direction in which the hook faces, and may be fixed to the wheel structure.

According to various embodiments, there may be provided an electronic device including: a housing including a rear plate facing in a first direction, a side member connected to the rear plate, and a first surface connected from the side member so as to face in a second direction opposite to the first direction; an edge portion disposed on the first surface of the housing; a wheel structure capable of rotating around the edge portion; and a ring structure disposed between at least a part of the edge portion and at least a part of the wheel structure. The ring structure may have a plurality of protrusions formed thereon, the plurality of protrusions including a first protrusion facing the edge portion and a second protrusion positioned on a virtual straight line joining the first protrusion and the center of the ring structure. The distance between the second protrusion and the housing may be larger than the distance between the first protrusion and the housing.

It would be obvious to a person skilled in the art to which the disclosure pertains that the structure for limiting movements of a rotatable member and an electronic device including the same, according to various embodiments of the disclosure described above, are not limited by the above-described embodiments and drawings, and various substitutions, modifications, and changes are possible within the technical scope of the disclosure.

The invention claimed is:
1. An electronic device comprising:
a housing including a rear plate facing in a first direction and a side member coupled to the rear plate, wherein the rear plate and the side member form a recess having a circular periphery;
a circular display positioned at least partially in the recess;
a wheel structure rotatable around the display; and
a ring structure formed of a polymeric material,
wherein, when viewed from above the recess, the side member comprises:
a first surface facing in a second direction opposite to the first direction, and including an inner edge and an outer edge; and
an annular protrusion protruding from the inner edge, while defining the circular periphery,
wherein the annular protrusion includes:
a second surface facing away from the recess in a third direction substantially perpendicular to the second direction; and
a first extension slot formed in the second surface near the recess,
wherein the wheel structure comprises:
a first inner surface facing the first surface;
a second inner surface facing the second surface; and
a second extension slot formed on the second inner surface around the recess,
wherein the ring structure includes a plurality of portions, each of the plurality of portions being partially inserted into the first extension slot and partially inserted into the second extension slot,
wherein at least one of the a plurality of portions includes an upper surface facing in a fourth direction forming an angle of 5° to 45° with the second direction,
wherein the plurality of portions include a first portion inserted into the first extension slot and a second portion inserted into the second extension slot, and
wherein the first portion is configured to be supported by the first extension slot, whereby the ring structure is configured to bias the wheel structure towards the first surface.
2. The electronic device of claim 1, wherein the angle is between 10° and 30°.
3. The electronic device of claim 1, wherein the angle is between 15° and 25°.
4. The electronic device of claim 1, wherein the angle is between 17° and 20°.
5. The electronic device of claim 1, wherein the angle is between 18° and 19°.
6. The electronic device of claim 1, wherein the polymeric material includes at least one of polyoxymethylene, polyacetal, and acetal resin.
7. The electronic device of claim 1, wherein a plurality of first portions and a plurality of second portions are provided and are disposed alternately along a circumferential direction of the ring structure.
8. The electronic device of claim 1, wherein the second portion is fitted into the second extension slot.
9. The electronic device of claim 1, wherein the plurality of portions include a third portion contained in a space between the second surface and the second inner surface.
10. The electronic device of claim 9, wherein the third portion is formed to be substantially perpendicular to the second portion.
11. The electronic device of claim 9, wherein the third portion includes a protrusion formed towards the second surface.
12. The electronic device of claim 11, wherein a plurality of protrusions are provided, the plurality of protrusions include a first protrusion and a second protrusion positioned on a virtual straight line joining the first protrusion and a center of the ring structure, and a distance between the second protrusion and the housing is larger than a distance between the first protrusion and the housing.
13. The electronic device of claim 1, wherein the ring structure is partially cut and is interposed between the wheel structure and the annular protrusion while an end of the ring structure and another end thereof substantially face each other.

* * * * *